United States Patent
Staszewski et al.

(10) Patent No.: US 8,126,401 B2
(45) Date of Patent: Feb. 28, 2012

(54) TRANSMITTER PLL WITH BANDWIDTH ON DEMAND

(75) Inventors: Robert Bogdan Staszewski, Garland, TX (US); Khurram Waheed, Plano, TX (US); Sudheer K. Vemulapalli, Allen, TX (US); Manouchehr Entezari, Highland Village, TX (US); Imran Bashir, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 525 days.

(21) Appl. No.: 12/412,790

(22) Filed: Mar. 27, 2009

(65) Prior Publication Data

US 2009/0325494 A1 Dec. 31, 2009

Related U.S. Application Data

(60) Provisional application No. 61/076,801, filed on Jun. 30, 2008.

(51) Int. Cl.
*H04B 1/00* (2006.01)
(52) U.S. Cl. ........... 455/42; 455/108; 455/110; 375/376
(58) Field of Classification Search .................. None
See application file for complete search history.

(56) References Cited

U.S. PATENT DOCUMENTS

| | | | |
|---|---|---|---|
| 6,809,598 B1 | 10/2004 | Staszewski et al. | |
| 7,046,098 B2 | 5/2006 | Staszewski | |
| 7,145,399 B2 | 12/2006 | Staszewski et al. | |
| 7,183,860 B2* | 2/2007 | Staszewski et al. | 331/1 A |
| 7,498,890 B2* | 3/2009 | Wallberg et al. | 331/17 |
| 2006/0038710 A1 | 2/2006 | Staszewski et al. | |
| 2008/0315960 A1* | 12/2008 | Waheed et al. | 331/17 |
| 2009/0149129 A2* | 6/2009 | Higuchi et al. | 455/42 |
| 2009/0258612 A1* | 10/2009 | Zhuang et al. | 455/110 |

* cited by examiner

*Primary Examiner* — Long Nguyen
(74) *Attorney, Agent, or Firm* — Ronald O. Neerings; Wade James Brady, III; Frederick J. Telecky, Jr.

(57) ABSTRACT

An embodiment of the present invention provides transmitter having a phase locked loop that has a dynamically controllable loop bandwidth. A transmit modulator is coupled to the PLL for performing vector modulation in response to transmission symbols. Each transmission symbol comprises an amplitude signal and a phase signal. A controller is coupled to the PLL and to the transmit modulator and is operable to detect when a criteria of the transmission symbols crosses a threshold and to adjust loop bandwidth in response to crossing the threshold. The criteria of the transmission symbols may be a function of the amplitude signal or a function of the phase signal, and may be the amplitude signal, a first derivative of the amplitude signal, a second derivative of the amplitude signal, a square of the amplitude signal, a derivative of the amplitude signal squared, the phase signal, or a derivative of the phase signal.

22 Claims, 12 Drawing Sheets

TRANSMITTER PLL WITH BANDWIDTH ON DEMAND

CLAIM OF PRIORITY UNDER 35 U.S.C. 119(e)

The present application claims priority to and incorporates by reference U.S. Provisional Application No. 61/076,801 filed Jun. 30, 2008, entitled "Transmitter PLL with Bandwidth on Demand".

FIELD OF THE INVENTION

This invention generally relates to the field of control systems and data communications. In particular, it relates to cellular telephony and communication devices such as Bluetooth, WLAN, etc. using digital radio frequency (RF) circuitry.

BACKGROUND OF THE INVENTION

Wireless cellular communication networks incorporate large numbers of mobile user equipment (UEs) and a number of base nodes (NodeBs). A NodeB is generally a fixed station, and may also be called a base transceiver system (BTS), an access point (AP), a base station (BS), or some other equivalent terminology. As improvements of networks are made, the NodeB functionality evolves, so a NodeB is sometimes also referred to as an evolved NodeB (eNB). In general, NodeB hardware, when deployed, is fixed and stationary, while the UE hardware is typically portable.

In contrast to NodeB, the mobile UE can comprise portable hardware. User equipment (UE), also commonly referred to as a terminal or a mobile station, may be fixed or mobile device and may be a wireless device, a cellular phone, a personal digital assistant (PDA), a wireless modem card, and so on. Uplink communication (UL) refers to a communication from the mobile UE to the NodeB, whereas downlink (DL) refers to communication from the NodeB to the mobile UE. Each NodeB contains radio frequency transmitter(s) and the receiver(s) used to communicate directly with the mobiles, which move freely around it. Similarly, each mobile UE contains radio frequency transmitter(s) and the receiver(s) used to communicate directly with the NodeB. In cellular networks, the mobiles cannot communicate directly with each other but have to communicate with the NodeB.

With each successive cellular phone handset generation, users demand more features in a smaller form factor. Some recent examples include cell phones with integrated Bluetooth, GPS, digital camera, and MP3 functionality. Process shrinks help deliver a cost and size advantage for digital designs with relative ease. However, for analog/RF designs, the immaturity of advanced processes comes with design challenges that may outweigh the intended advantage. In a older generation handsets, 30 to 40% of handset board space is occupied by analog/RF functionality which cannot be re-designed or migrated to the newer process/technology nodes easily, inhibiting vendor ability to cost effectively add features and reduce footprint.

Digital radio has recently allowed the replacement of space consuming analog RF circuitry with much more compact digital circuitry, thereby facilitating the ability to port designs rapidly to more advanced lithographies. Texas Instruments (TI) has proven this concept with its Digital RF Processor (DRP™) architecture, which it has successfully implemented in production versions of its Bluetooth BRF6xxx transceivers, GSM/GPRS LoCosto TCS23xx transceivers among other chips. DRP implementation is consistent with the ongoing trend toward RF-CMOS in the cellular area, making it attractive in terms of power consumption, cost, and the integration of multiple radios.

Oscillators are a key component in the design of radio frequency (RF) communication systems. The estimation and calibration of the modulation gain of an RF oscillator is currently an area of active research. Accurate knowledge of this gain significantly reduces the complexity and increases the performance of the phase-locked loop (PLL) as well as the transmit frequency modulation path. It is particularly beneficial in systems implemented in deep submicron and nanoscale CMOS and based on orthogonal frequency/phase and amplitude (i.e. polar) topology. Estimation of RF oscillator frequency-modulation gain is especially important in low-cost dominantly digital high-volume transceivers. In such systems, the phase locked loop sets the loop bandwidth while the transmitter sets the transfer function of the direct frequency modulation path wherein the acceptable gain estimation error ranges from less than 1% for LTE/WCDMA to several percents for EDGE (Enhanced Data rates for GSM Evolution), GSM and Bluetooth, for example.

An all-digital frequency synthesizer architecture built around a digitally controlled oscillator (DCO) that is tuned in response to a digital tuning word (OTW) is described in U.S. Pat. No. 7,046,098 entitled "All-digital frequency synthesis with capacitive re-introduction of dithered tuning information" and is incorporated by reference in its entirety herein.

All known EDGE transmitters are affected by modulation distortion due to the RF oscillator pulling by the transmitted RF output and supply-ground coupling of extraneous noise sources. Whether using a polar or I/Q TX modulator, the instantaneous transmitted frequency at the SoC (system on a chip) output or PA (power amp) output is different from the resonant frequency of the RF oscillator, thus creating a frequency puling force. Correspondingly supply-ground coupling of extraneous noise and current spikes generated by other circuits on the same die causes frequency pushing of the oscillator.

In a typical EDGE transmitter, amplitude modulation of the pre-power amplifier (PPA) causes frequency pulling of the DCO thus leading to the degradation in error vector magnitude (EVM). The pulling problem is currently solved in industry by (1) significantly increasing the loop bandwidth: (2) using offset PLL architecture that is based on non-harmonic frequency planning. Both of these methods significantly increase the hardware complexity and consumed power.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
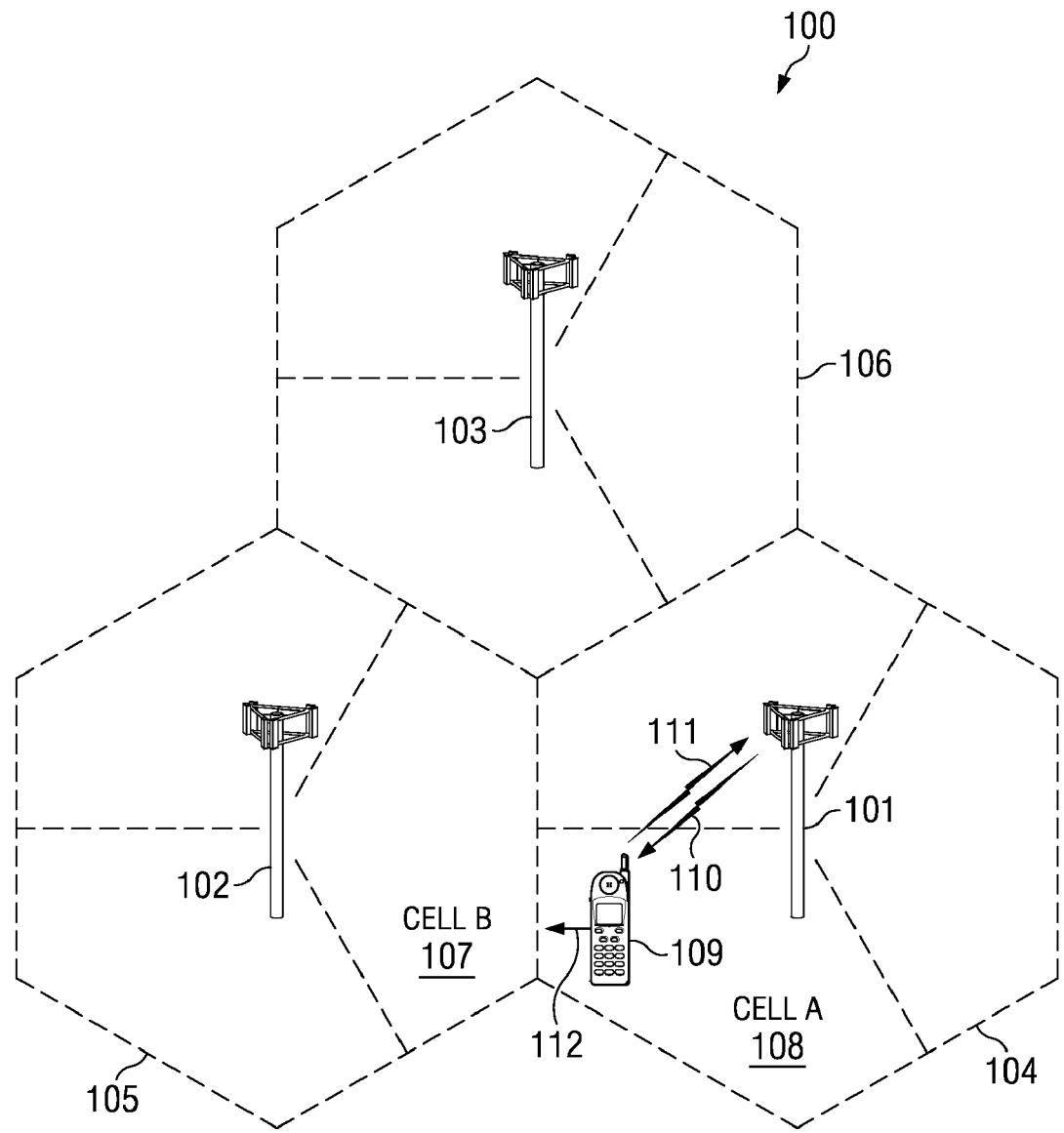
FIG. 1 is a pictorial of an illustrative telecommunications network that employs an embodiment of bandwidth on demand in transceivers used in the network.

To aid in understanding the principles of the present invention, a description is provided in the context of a digital RF processor (DRP) transmitter and receiver that may be adapted to comply with a particular wireless communications standard such as GSM (Global System for Mobile communication), Bluetooth, WCDMA (Wideband Code Division Multiple Access), etc. It is appreciated, however, that the invention is not limited to use with any particular communication standard and may be used in control, optical, wired and wireless applications. Further, the invention is not limited to use with a specific modulation scheme but is applicable to any modulation scheme including both digital and analog modulation.

Note that throughout this document, the term communications device is defined as any apparatus or mechanism adapted to transmit, or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

A key component of transmitter is a digitally controlled oscillator (DCO) that is part of an interpolated all-digital phase-locked loop (ADPLL). The DCO avoids any analog tuning controls. The DCO generates a high-quality base station-synchronized frequency reference such that the transmitted carrier frequencies and the received symbol rates are accurate to within 0.1 ppm.

In the current embodiment of the ADPLL architecture, which is strictly optimized for low area and power consumption, maintaining an excessive ADPLL bandwidth all the time in order to manage noise induced oscillator pulling would degrade spectral mask by less filtering of the reference and TDC (time to digital converter) phase noise. Embodiments of the present invention dynamically increase the ADPLL loop bandwidth only when it is really needed. During the course of modulation, the significant pulling force exists only for a fraction of the time. Therefore most of the time it is not strong enough to create a noticeable degradation in error vector magnitude (EVM). Engaging a wide ADPLL bandwidth only at the time of strong frequency pulling mitigates its negative effects and leads to only a small increase in the close-in phase noise. For example, if the duty cycle of the wide bandwidth is 50% then the resultant modulation spectrum will be midway between that of the normal bandwidth and wide bandwidth. Typically, the wide bandwidth duty cycle will be much less than 50%.

An advanced All-Digital PLL (ADPLL) frequency synthesizer is described in US Patent application 2008-0315960 to Waheed et al entitled "Digital Phase Locked Loop with Gear shifting" which is incorporated by reference herein in its entirety. Portions of the ADPLL that are relevant to embodiments of the present invention are also described herein. This advanced all-digital frequency synthesizer possesses two-point digital, i.e., reference and direct, frequency modulation capability. ADPLL uses digital signal processing and efficient circuit design techniques. A 4 or 8 GHz digitally-controlled oscillator (DCO) is at the heart of ADPLL, where fine frequency resolution is achieved through high-speed sigma-delta ($\Sigma\Delta$) dithering. This setup allows for ADPLL loop control circuitry to be implemented in a fully digital manner using Infinite Impulse Response (IIR) filters and a digital Proportional-integral (PI) controller. For the feedback of DCO phase in the time-domain, very fine time resolution (~20 ps) is achieved by employing a Time-to-Digital Converter (TDC) comprising a chain of digital inverters.

The ADPLL architecture is distinct in that the loop filter and bulk of the logic operates on an RF derived variable clock domain. Due to the common RF based clock source for the major digital components, convenient digital handoff is achieved in the signal paths. The architecture uses two resamplers (one linear and the other a simple zero-order hold) for the exchange of data from and to the reference clock domain to the variable RF clock domain. In the variable clock domain, availability of several edge-aligned clock domains also facilitate physical register transfer logic (RTL) hardware sharing by time slicing. ADPLL can be embodied by more than one arrangement of the resampler and the other digital blocks. While several embodiments will be described herein, these descriptions are not intended to be limiting.

FIG. 1 shows an exemplary wireless telecommunications network 100. The illustrative telecommunications network includes representative base stations 101, 102, and 103; however, a telecommunications network necessarily includes many more base stations. Each of base stations 101, 102, and 103 are operable over corresponding cell coverage areas 104, 105, and 106. Each base station's coverage area may be further divided. In the illustrated network, each base station's coverage area is divided into three cells. Handset or other UE 109 is shown in Cell A 108, which is within coverage area 104 of base station 101. Base station 101 is transmitting to and receiving transmissions from UE 109 via downlink 110 and uplink 111. As UE 109 moves out of Cell A 108, and into Cell B 107, UE 109 may be handed over to base station 102. A UE in a cell may be stationary such as within a home or office, or may be moving while a user is walking or riding in a vehicle. UE 109 moves within cell 108 with a velocity 112 relative to base station 102.

In one embodiment, UE 109 is transmitting to and receiving from base station 101 voice and/or data transmissions. As the UE is transmitting, various transmission symbols will have different amplitudes which will cause different amounts of power to be required in the pre-power amplifier of the transmitter. As discussed earlier, these power shifts tend to induce frequency pulling of the DCO. As discussed above, the present embodiment of the ADPLL minimizes pulling by detecting an impending power spike and then increasing loop bandwidth for a short period of time in order to restore proper frequency operation, as will be explained in more detail below.

Figure 2:
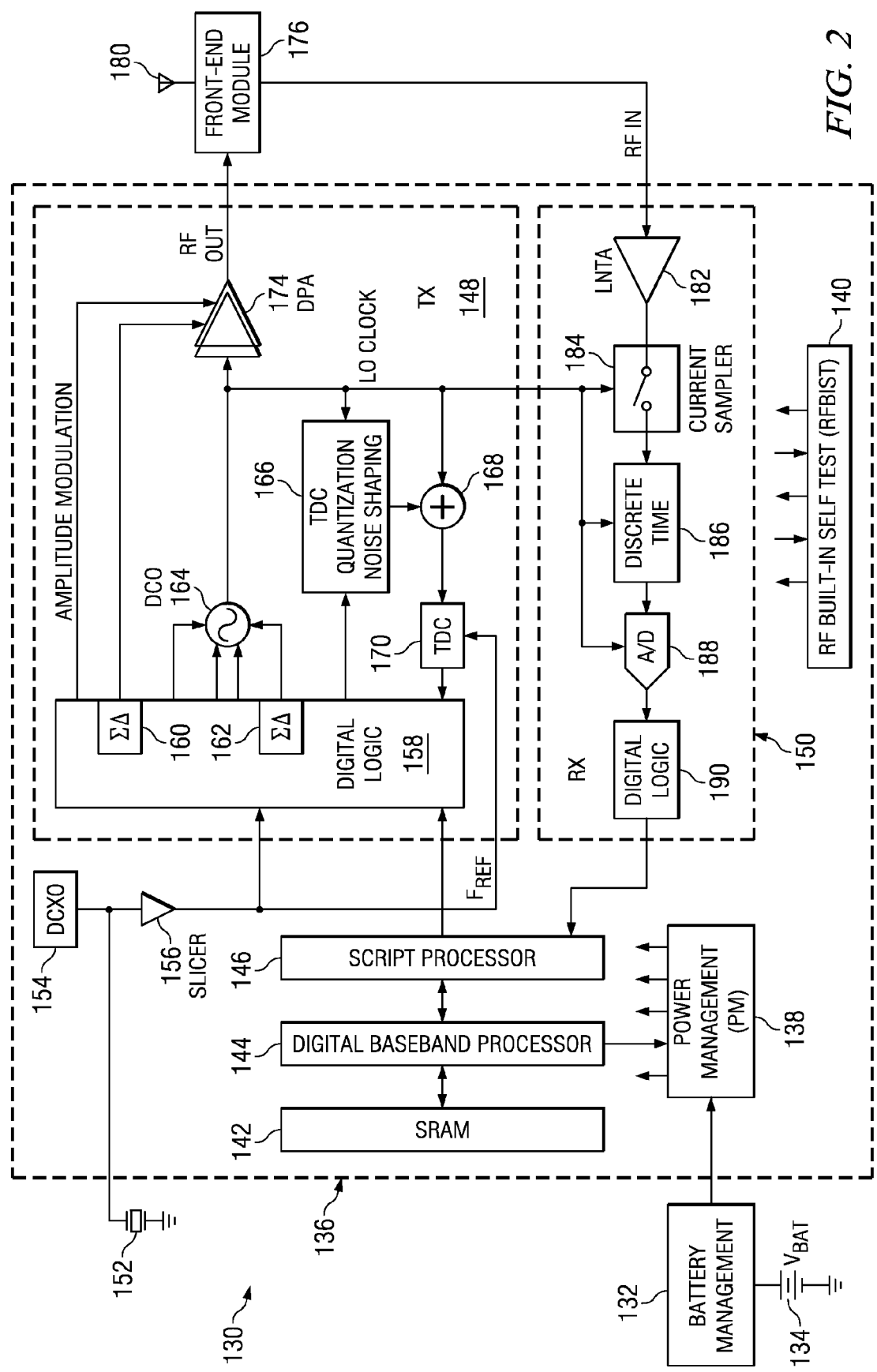
FIG. 2 is a block diagram of a single-chip radio with an all-digital local oscillator and transmitter and a discrete-time receiver.

A block diagram illustrating a single chip radio incorporating an interpolative all-digital local oscillator based polar transmitter and digitally-intensive receiver is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention. This embodiment of a DRPu for UMTS is a Digital RF Processor (DRP)-based dominantly digital transceiver integrated with a digital baseband processor in 45 nm CMOS technology. This DRPu EDGE/WCDMA (2.5G/3G) transmitter (TX) uses a polar transmission architecture but the inventive techniques would also be applicable to the Cartesian or I/Q architecture. The complex number signals have two equally valid representations: Cartesian or polar.

The radio circuit, generally referenced 130, comprises a radio integrated circuit 136 coupled to a crystal 152, antenna front end module 176 connected to antenna 180 and battery management circuit 132. The radio chip 136 comprises a script processor 146, digital baseband (DBB) processor 144, memory 142 (e.g., static RAM), transmit (TX) block 148, receiver (RX) block 150, digitally controlled crystal oscillator (DCXO) 154, slicer 156, power management unit 138, RF built-in self test (BIST) 140. Battery 134 and battery management circuit 132 are connected to radio chip 136 for providing power. The TX block comprises high speed and low speed digital logic block 158 including sigma-delta (ΣΔ) modulators 160, 162, digitally controlled oscillator (DCO) 164, digitally controlled power amplifier (DPA) 174 or pre power amplifier (PPA), time-to-digital converter (TDC) circuit 170 and TDC quantization noise shaping block 166. The transmitter generates various radio frequency signals, as defined by the 3GPP specifications. For example, the transmitter may support one or more of the 3G UMTS frequencies: 850, 900, 1700, 1900, or 2100 MHz.

A key component of transmitter block 148 is digitally controlled oscillator (DCO) 164, that is part of an interpolated-digital phase-locked loop (ADPLL). DCO 164 avoids any analog tuning controls. The DCO generates a high-quality base station-synchronized frequency reference such that the transmitted carrier frequencies and the received symbol rates are accurate to within 0.1 ppm. Fine frequency resolution is achieved through high-speed sigma-delta (ΣΔ) dithering of its varactors. Digital logic built around the DCO realizes an interpolated all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 174 for the amplitude modulation. The DPA operates in near-class-E mode and uses an array of nMOS transistor switches to regulate the RF amplitude and acts as a digital-to-RF amplitude converter (DRAC). It is followed by a matching network and an external antenna front-end module 176, which comprises a power amplifier (PA), a transmit/receive switch for the common antenna 180 and RX surface acoustic wave (SAW) filters. Fine amplitude resolution is achieved through high-speed ΣΔ dithering of the DPA NMOS transistors. The ADPLL also comprises TDC quantization noise shaping block 166 operative to reduce the quantization noise contribution of the TDC. It is noted that the TDC quantization noise shaping mechanism is especially applicable in the ADPLL circuit.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a COordinate Rotation Digital Computer (CORDIC) algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

The receiver employs a discrete-time architecture in which the RF signal is directly sampled and processed using analog and digital signal processing techniques. RX block 150 comprises a low noise transconductance amplifier 182, current sampler 184, discrete time processing block 186, analog to digital converter (ADC) 188 and digital logic block 190. The receiver 150 employs a discrete-time architecture in which the RF signal is directly sampled at the Nyquist rate of the RF carrier and processed using analog and digital signal processing techniques. The transceiver is integrated with a script processor 146, dedicated digital base band processor 144 (i.e. ARM family processor and DSP) and SRAM memory 142. The script processor handles various TX and RX calibration, compensation, sequencing and lower-rate data path tasks and encapsulates the transceiver complexity in order to present a much simpler software programming model.

The frequency reference (FREF) is generated on-chip by a 38.4 MHz (but could be 26.0 MHz or another frequency in another embodiment) digitally controlled crystal oscillator (DCXO) 154 coupled to slicer 156. An integrated power management (PM) system is connected to an external battery management circuit 132 that conditions and stabilizes the supply voltage. The PM comprises a switched mode power supply (SMPS) as well as multiple low drop out (LDO) regulators that provide internal supply voltages and also isolate supply noise between circuits, especially protecting the DCO. The SMPS is used for efficient conversion of the battery voltage to a level that can be used by on-chip LDOs. The RF built-in self-test (RFBIST) 140 performs autonomous phase noise and modulation distortion testing, various loopback configurations for bit-error rate measurements and implements various DPA calibration and BIST procedures. The transceiver is integrated with the digital baseband, SRAM memory in a complete system-on-chip (SoC) solution.

Almost all the clocks on this SoC are derived from and are synchronous to the RF oscillator clock. This helps to reduce susceptibility to the noise generated through clocking of the massive digital logic. A fixed clock module (not shown) provides a buffered fixed clock signal that provides timing for DBB 144, script processor 146, SRAM 142 and other functional logic. In this embodiment, the fixed clock is derived from the variable RF oscillator clock CLKVx. In other embodiments, the fixed clock could be derived from the reference clock produced by DCXO 154, or from another independent clock source.

Figure 3:
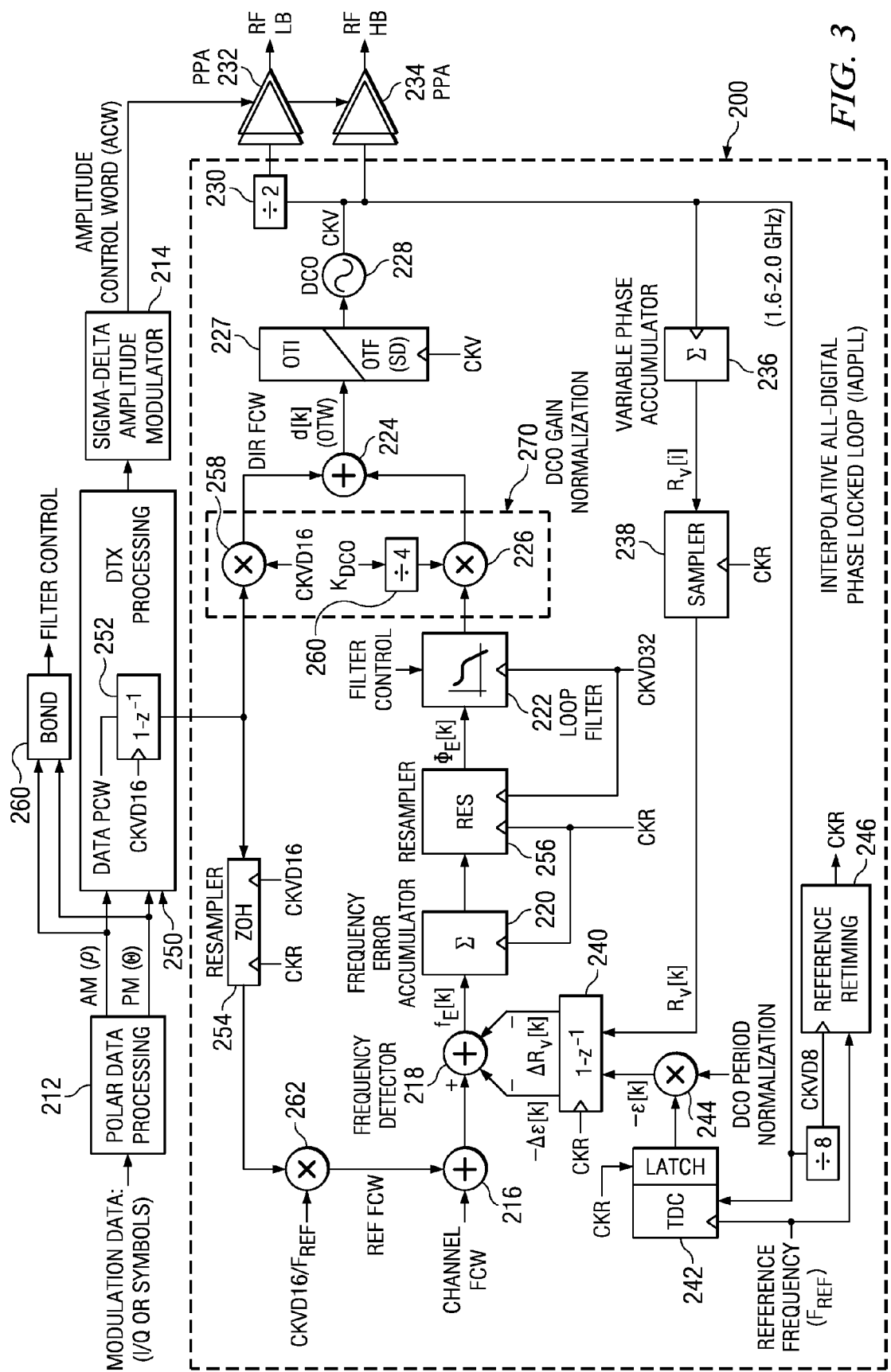
FIG. 3 is a more detailed block diagram illustrating the all-digital phase locked loop (ADPLL) based polar transmitter of FIG. 1 constructed in accordance with the present invention.

FIG. 3 is a more detailed block diagram of an ADPLL 200 used in the transceiver of FIG. 1 and constructed in accordance with the present invention. For illustration purposes only, the transmitter of the present embodiment is adapted for the GSM/EDGE cellular standard. It is appreciated, however, that one skilled in the communication arts can adapt the transmitter illustrated herein to other modulations and communication standards as well without departing from the spirit and scope of the present invention. For example, the transmitter illustrated in FIG. 3 can be extended for performing an arbitrary quadrature modulation scheme.

A description of the ADPLL, generally referenced 200, including the frequency/phase modulation path is provided herein below. The core of the ADPLL is a digitally controlled oscillator (DCO) 228 adapted to generate the RF oscillator clock CKV. The oscillator core (not shown) operates at twice the 1.6-2.0 GHz high frequency band or four times the 0.8-1.0 GHz low frequency band. The output of the DCO is then divided for precise generation of RX quadrature signals, and for use as the transmitter's carrier frequency. For GSM/EDGE transceivers, a single DCO is shared between transmitter and receiver and is used for both the high frequency bands (HB) and the low frequency bands (LB). However, for modern 3G (WCDMA) or other duplex transmission systems, separate local oscillators might be needed to supply TX and RX carrier frequencies.

A digitally-controlled oscillator (DCO) lies at the heart of the interpolated all-digital PLL (ADPLL) frequency synthesizer. It deliberately avoids any analog tuning voltage controls and is realized as an ASIC cell with truly digital inputs and outputs. The DCO comprises tunable switchable varactor elements, cross-coupled pairs of NMOS transistors, and a biasing circuit. The DCO varactors may be realized as n-poly/ n-well MOS capacitor (MOSCAP) devices that operate in the flat regions of their C-V curves. Current advanced CMOS process lithography allows creation of extremely small-size but well-controlled varactors. The switchable capacitance of the finest differential TB varactor is in tens of attofarads. This resolution, however, is still too coarse for wireless applications and requires high-speed ΣΔ dithering to enhance the time-averaged frequency resolution. The output of the DCO is input to the RF high band power amplifier 234. It is also input to the RF low band power amplifier 232 after divide by two in divider 230.

In case of transmit modulation, the symbols, (for example GSM, EDGE, WCDMA, etc), in the form of in-phase and quadrature data streams are received from the digital baseband (DBB) circuit 144 in FIG. 2. The GSM symbols are passed through a pulse-shaping filter (PSF) within processor 212 that converts it to phase modulation. This phase modulation is interpolated in transmit data (DTX) processing circuit 250 and then passed on to the ADPLL after differentiation at the CKVD16 clock rate using differentiator 252. CKV is the ADPLL RF output digital variable clock in case of high-bands (HB>1 GHz) or twice the RF output clock in case of low-band (LB, <1 GHz).

For the case of EDGE, WCDMA, etc. the complex vector modulation I/Q (in-phase signal and quadrature signal) data streams are fed to a COordinate Rotation DIgital Computer (CORDIC) within processor 212, which converts it from Cartesian to polar representation. The resulting amplitude modulation signal is passed through sigma-delta amplitude (SAM) signal processing blocks 214 before they are passed onto the on-chip digital pre-power amplifier (DPA) 234, while the phase modulation output of the cordic is passed onto the ADPLL after the necessary interpolation and signal processing, which performs the phase modulation of the DCO.

Bandwidth on Demand (BonD) module 260 monitors the amplitude modulaton (AM) signal and the phase modulation (PM) signal produced by the CORDIC module. In some embodiments, only the amplitude modulation signal is monitored. As will be described in more detail below, BonD module 260 changes parameters in loop filter 222 to increase loop bandwidth when an impending power spike or sudden change is detected, and then restores the parameters to narrow the loop bandwidth after the power spike has subsided.

Under no modulation conditions, ADPLL digitally controls the DCO to produce a stable variable clock (CKV) in the targeted RF frequency band. In the feedback path, CKV is used for phase detection and reference retiming. The time to digital phase conversion in the feedback happens using a TDC inverter chain 242.

The channel and data frequency control words are in the frequency command word (FCW) format, which is defined as the fractional frequency division ratio N, with a fine frequency resolution limited only by the FCW word-length. For example, with 24 fractional FCW bits, the frequency granularity using a 38.4 MHz reference frequency is 38.4 MHz/$2^{24}$≅2.29 Hz. In this embodiment, the direct point frequency injection is at the CKVD16 (which is 1×HB/2×LB channel frequency divided by 16, i.e., CKVD16=$f_V$/16) rate, so the possible DCO frequency resolution is in the range of 6~7.5 Hz (computed as $f_V/16/2^{24}$).

The frequency reference (FREF) clock contains the only reference timing information for the RF frequency synthesizer to which phase and frequency of the RF output are to be synchronized. The RF output frequency ($f_V$) is related to the reference frequency $f_R$ according to the following formula.

$$f_V = N f_R \qquad (1)$$

where, N=$f_V/f_R$≡FCW.

Synchronous Phase-Domain Operation

The ADPLL operates in a digitally-synchronous fixed-point phase domain. The variable phase $R_V[i]$ is determined by counting the number of rising clock transitions of the DCO oscillator clock CKV using variable phase accumulator 236.

The variable phase $R_V[i]$ is sampled via sampler 238 to yield sampled FREF variable phase $R_V[k]$, where k is the index of the FREF edge activity. The sampled FREF variable phase $R_V[k]$ is fixed-point concatenated with the normalized time-to-digital converter (TDC) 242 output ϵ[k]. The TDC measures and quantizes the time differences between the frequency reference FREF and the DCO clock edges. The sampled differentiated (via block 240) variable phase is subtracted from the frequency command word (FCW) by a synchronous arithmetic phase detector 218. The reference phase $R_R[k]$ is conceptually obtained by accumulating FCW with every cycle of the retimed frequency reference (FREF) clock input.

The frequency error $f_E[k]$ samples are accumulated via the frequency error accumulator 220 to create the phase error $\phi_E[k]$ samples. The digital phase error $\phi_E[k]$ is filtered by a digital loop filter 222 and then normalized by the DCO gain normalization circuit 270 in order to correct the DCO phase/frequency in a negative feedback manner. The loop behavior due to its digital nature is independent of process, voltage and temperature variations. The FREF retiming quantization error ϵ[k] is determined by the time-to-digital converter (TDC) 242 and the DCO period normalization multiplier 244. The TDC is built as a simple array of cascaded inverter delay elements and flip-flops, which produces time conversion resolution finer than 25 ps in the design process.

It must be recognized that the two clock domains, FREF and DCO, are not entirely synchronous and it is difficult to physically compare the two digital phase values without having to face meta-stability problems. During the frequency acquisition, their edge relationship is not known and during the phase lock the edges will exhibit rotation if the fractional FCW is non-zero. Consequently, the digital-word phase comparison is performed in the same clock domain. The synchronous operation is achieved by over-sampling the FREF clock using a higher-rate DCO derived clock (typically CKVD8) in reference retiming circuit 246. The resulting retimed CKR clock is thus stripped of the FREF timing information and is used throughout the system. This ensures that the massive digital logic is clocked after the quiet interval of the phase error detection by the TDC.

The main advantage of representing the phase information in fixed-point digital numbers is that, after the conversion, it cannot be further corrupted by noise. Consequently, the phase detector could be simply realized as an arithmetic subtractor that performs an exact digital operation. Thus, having a single conversion place, where the continuously-valued clock transition edge delay is quantized within the TDC, the susceptibility to noise and quantization errors is minimized and well controlled. It should be emphasized that it is very advantageous to operate in the phase domain for several reasons. First, the phase detector used is not a conventional correlative multiplier generating reference spurs. DRP architecture uses an arithmetic subtractor 218, which does not introduce any spurs into the loop. Second, the dynamic range of the phase error could be made arbitrarily large simply by the increasing word-length of the phase/frequency accumulators. Conventional three-state phase/frequency detectors are typically limited to only ±2π of the compare rate. Third, the phase domain operation is more amenable to digital implementations, contrary to the conventional approach.

High-Speed Direct Frequency Modulation Capability

As shown in FIG. 3, the oscillating frequency deviation Δf is dynamically controlled by directly modulating the DCO frequency in a feed-forward manner. The ADPLL loop compensates by effectively removing the loop dynamics from the modulating transmit path (using the reference modulation injection). The remainder of the loop, including all error sources, operates under the normal closed-loop regime. This method is similar to the conventional two-point direct modulation scheme but because of the digital nature, it is exact and does not require any analog component matching, except for the DCO gain $K_{DCO}=\Delta f/\Delta OTW$ calibration, which is achieved in using a robust hybrid stochastic-gradient algorithm implemented in digital domain, where OTW is the oscillator tuning word and is analogous to the voltage tuning of a VCO.

The fixed-point frequency modulating data FCW is sampled in resampler 254 by the ADPLL DCO injection frequency $f_V/16$ and normalized in multiplier 262 to the value of ADPLL DCO injection frequency $f_V/16$. Through multiplier 258, using the direct injection of the normalized FCW directly at the DCO impacts the oscillating frequency. The PLL loop will try to correct this perceived frequency perturbation integrated over the update period of $1/f_R$, which is then interpolated to the ADPLL operational frequency of $f_V/32$ in resampling interpolator 256. This corrective action is compensated by the other (compensating) reference feed that If the estimated DCO gain is accurate, i.e., $\hat{K}_{DCO} \cong K_{DCO}$, then the loop response to the modulation is flat from dc to $f_V/64$ (or half of ADPLL operational frequency $f_V/32$). The immediate and direct DCO frequency control, made possible by accurate prediction of the DCO transfer function, is combined with the phase compensation of the PLL loop response. The two factors constitute the hybrid of predictive/closed PLL loop modulation method.

Advantages of Using Higher Rate Direct-point Modulation Injection

One of the key advantages of using a direct point injection rate (say of channel frequency divided by 16) is that the phase modulation can be presented to the DCO with a finer resolution. For example, the phase modulation in GSM has a BW of 200.00 kHz, while for a polar TX, in EDGE mode the phase modulation BW is approx. 2.0 MHz (LB) and 1.0 MHz (HB). The CKVD16 rate corresponds to an injection frequency range of 103-124 MHz, which is at least three times higher than an FREF of 38.4 MHz, and 4 times higher than an FREF of 26 MHz. This implies that the phase modulation data update using a CKVD16 rate will be 3-4 times finer than the FREF rate used in the previous generations of ADPLL.

Furthermore, the data injection into the DCO comprises an integer and fractional parts, described in more detail below. The injection rate creates an effective zero order hold (ZOH) at resampler 254. The ZOH operation does not provide a large attenuation to the sampling replicas, which is only 13 dB lower for 2nd harmonic and approx. 17 dB for 3rd harmonic. As CKVD16 frequency is much higher than FREF, these replicas are correspondingly at 3-4 times higher frequency for CKVD16 (>100 MHz) vs. FREF (26-38.4 MHz). The DCO phase noise beyond the flicker corner of 1-2 MHZ has a 20 dB/decade slope, which implies that the residual sampling replicas after ZOH 254 sync filtering will receive an additional attenuation of 12 dB using CKVD16 injection rate as compared to FREF. In short, use of CKVD16 for direct point phase modulation injection results in pushing any sampling replicas to frequencies greater than 100 MHz from the carrier, where they are greatly attenuated by the DCO phase noise and the spectral skirt of the loop filter. Essentially these signal processing spurs are below the noise floor and can not be seen in realistic simulations or measurements.

Another important benefit of using CKVDx, where x=16 or 8 for direct point injection is that the quality of phase modulation injection becomes independent of the FREF frequency. The same ADPLL when used with different FREF's, say 26, 38.4 or 52 MHz will exhibit the same direct point injection fidelity. However, note that there are other noise scaling terms that will be impacted by the FREF frequency change, but the ADPLL loop filters, modulation injection rates etc. will maintain their resolution across multiple possible reference frequencies.

It has been observed in previous versions of the ADPLL that the current spikes caused by clocking of bulk of the logic can be a source of spurious emissions. This is especially true for highly integrated transceivers targeted using DRP technology. For ADPLL, a significant part of the loop filter and DCO interface logic executes on the LO derived clock domain. Since most of these frequencies are chosen to be higher than FREF, any such spurious products will have a larger intra-spur distance than FREF. For example, using CKVD32, the spurs (if present) will be 52-62 MHz apart as compared to FREF frequencies. In retrospect, the current spikes due to the modulation injection rate into DCO have the highest impact, as the rush current to the boundary level-shifters might be supplied by the same LDO supply regulator, which powers DCO. The most critical among these spurs are the ones that appear in the corresponding GSM/EDGE RX band during transmission. The widest GSM RX band is 65 MHz, and using CKVD16 at the interface at most one spur may appear in the RX band due to these parasitic supply regulation issues. Therefore, the use of a higher direct-point injection frequency (>100 MHz) theoretically reduces the possibility of multiple spurs in the RX band.

Figure 4:
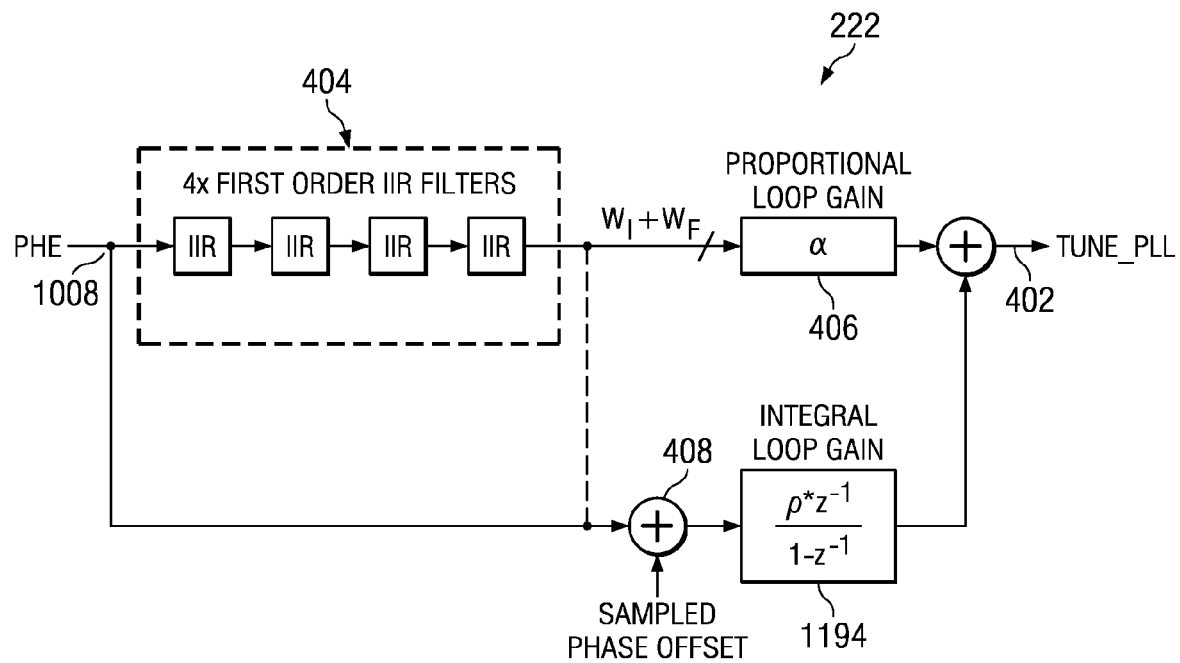
FIG. 4 is a block diagram of the loop filter for the ADPLL of FIG. 2.

FIG. 4 is a block diagram of loop filter 222 for the ADPLL of FIG. 3. The loop filter's main input is the PHASE_ERR signal 1008 output from the RESAMPLER block 256. Its main function is to first filter the phase error signal and then feed the filtered phase error signal to the proportional-integral controller (equivalent of type-II operation in an analog PLL) of the DCO. Note that the applied proportional and integral gains include DCO gain normalization for each of the DCO capacitor banks. The loop filter outputs TUNE_PLL 402, which is the tuning word contribution due to the PLL. This is added (not shown on FIG. 4, but shown on FIG. 3 by adder 224) with TUNE_TX (the feed-forward modulation injection) in the DCO interface (DCOIF) block to produce the composite OTW word (as shown in FIG. 3).

The proportional part 406 of the ADPLL loop has a gain alpha, which is used in both type-I (used for the DCO PVT and Acquisition bank tuning) and type-II (used for DCO tracking bank tuning) operational modes of ADPLL. ADPLL can have different programmable alpha coefficients that can be used based on the operational mode.

The four IIR filters 404 exist to filter the noisy PHASE_ERR or PHE signal. All four IIR stages are similar with following first-order transfer function:

$$y[n]=2^{-\lambda}*x[n]+(1-2^{-\lambda})*y[n-1] \quad (1)$$

where lambda is a programmable value and can take any value from 0 to 7.

The integral loop 1194 is intended to only work in tracking mode once the proportional loop is already quite close to the desired channel frequency. This is followed to minimize the overall settling time of ADPLL, otherwise, there is no hardware limitations forcing this to only be used during tracking. By adding an integrator to the loop, the loop will work to zero out the phase error. To prevent this long settling, the integral loop samples the current IIR filtered PHE and uses the result to subtract 408 from subsequent phase error samples. This results in a new offset error signal that can be forced to zero deviation by the integral control. The offset error value is then accumulated by the digital integrator and multiplied by the integral gain, rho, before it is added to the proportional correction.

Figure 5:
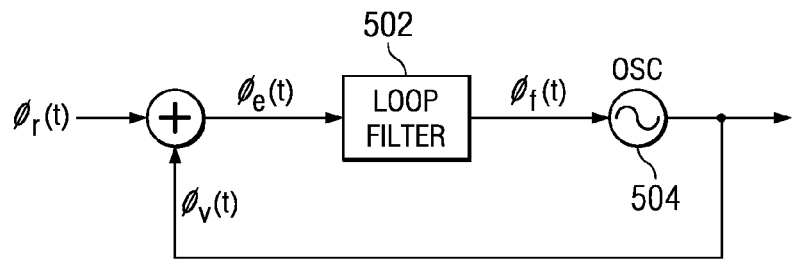
FIG. 5 represents a simple model of the loop filter to illustrate various dynamic operating possibilities.

FIG. 5 represents a simple model of the loop filter to illustrate various dynamic operating possibilities. Filter 502 represents embodiments of filter 222. Oscillator 504 represents oscillator 228. Two cases will be described: 1) a simple proportional-integral (PI) filter, and 2) a PI filter preceded by a set of infinite impulse response (IIR) filters. To compute the dependence of the PLL dynamics on the loop filter parameters, equation 2 represents the general operation of filter 502:

$$\phi_e(t)=\phi_r(t)-\phi_v(t) \quad (2)$$

Case I

For the case of a type-II PLL, when the loop filter 502 is a simple PI controller, the filtered phase error of $\phi_f(t)$ is given by $$\phi_f(t) = \alpha \phi_e(t) + \rho \int_t \phi_e(\tau) d\tau \tag{3}$$

where $\alpha$ and $\rho$ are the proportional and integral gains of the controller In frequency domain, the loop filter transfer function is $$H(s) = \frac{\phi_F(S)}{\phi_E(S)} \tag{4}$$

$$= \alpha + \frac{\rho}{s}$$

With the oscillator 504 being represented by a simple integrator, i.e., $$O(s) = \frac{1}{s},$$

we can write the PLL transfer function as $$G(s) = \frac{H(s)O(s)}{1 + H(s)O(s)} \tag{5}$$

$$= \frac{\left(\alpha + \frac{\rho}{s}\right) \cdot \frac{1}{s}}{1 + \left(\alpha + \frac{\rho}{s}\right) \cdot \frac{1}{s}}$$

$$= \frac{s\alpha + \rho}{s^2 + s\alpha + \rho}$$

Comparing the denominator with a generic $2^{nd}$ order system transfer function, we have $$s^2 + s\alpha + \rho = s^2 + 2\zeta\omega_n s + \omega_n^2 \tag{6}$$

Comparing coefficients, we get $$2\zeta\omega_n = \alpha$$

$$\omega_n^2 = \rho \tag{7}$$

and simplifying the relations along with the standard relation for frequency response of a $2^{nd}$ order system $$\omega = \omega_n \sqrt{1 - \zeta^2} \tag{8}$$

we have $$\omega_n = \sqrt{\rho} \tag{9}$$

$$\zeta = \frac{\alpha}{2 \cdot \sqrt{\rho}}$$

$$\omega = \sqrt{\rho - \frac{\alpha^2}{4}}$$

Therefore, for the simple PLL, the settling time of the system is given by $$t_s = \frac{4}{\zeta \omega_n} = \frac{8}{\alpha} \tag{10}$$

It is evident from (9) and (10) that the key ADPLL parameters such as the damped frequency response, loop bandwidth and phase margin are a function of both PI controller parameters.

Case II

For the case of a type-II PLL, when the loop filter comprises a set of filters followed by a PI controller, as illustrated in FIG. 4, The z-domain transfer function of the ADPLL loop filter 222 is given by $$H(z) = \alpha F(z) + \frac{\rho z^{-1}}{1 - z^{-1}} \tag{11}$$

where $\alpha$ and $\rho$ are the proportional and integral gains of the controller and $F(z)$ is the transfer function of the IIR filters given by $$F(z) = \prod_{i=0}^{3} \frac{\lambda_i}{1 + (1 - \lambda_i) z^{-1}} \tag{12}$$

In s-domain, the corresponding loop filter transfer function is $$H(s) = \frac{\phi_F(s)}{\phi_E(s)} = \alpha F(s) + \frac{\rho}{s} \tag{13}$$

where $F(s)$ is the s-domain equivalent transfer function of the IIR filters. Therefore, the ADPLL transfer function becomes $$G(s) = \frac{s\alpha F(s) + \rho}{s^2 + s\alpha F(s) + \rho} \tag{14}$$

Comparing the denominator with a generic $2^{nd}$ order system transfer function, we have $$s^2 + s\alpha F(s) + \rho = s^2 + 2\zeta\omega_n s + \omega_n^2 \tag{15}$$

Comparing coefficients, and simplifying we get the following relations for the ADPLL dynamics $$\omega_n = \sqrt{\rho} \tag{16}$$

$$\zeta = \frac{\alpha F(s)}{2 \cdot \sqrt{\rho}}$$

$$\omega = \sqrt{\rho - \frac{\alpha^2 F(s)^2}{4}}$$

Therefore, for the simple PLL, the settling time of the system is given by $$t_s = \frac{4}{\zeta \omega_n} = \frac{8}{\alpha F(s)} \tag{17}$$

Therefore the damping factor ζ (and hence the phase margin) and the damped frequency response ω of the PLL are a function of the PI gain control parameters as well as the transfer function of the filters preceding the proportional gain block.

Figure 6:
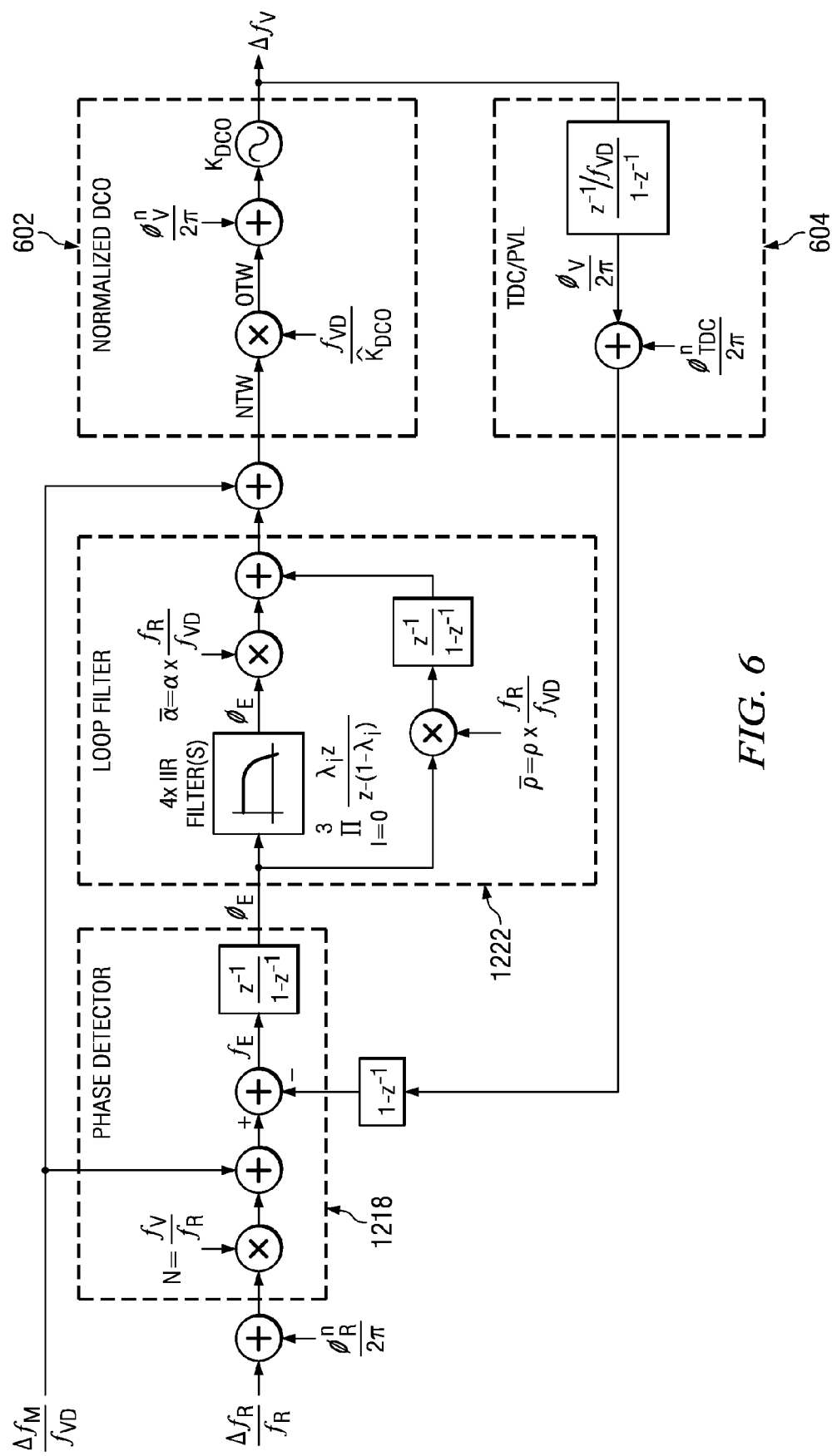
FIG. 6 is a z-domain block diagram for the ADPLL with all ADPLL operations shown at $f_{VD}$.

FIG. 6 shows a z-domain model of the ADPLL, i.e., the input and the output of the ADPLL are in terms of frequency units. The model includes phase detector module 1218, loop filter module 1222, normalized DCO module 602 and feedback TDC/PVL module 604. The loop filter 1222 for ADPLL comprises four independently controlled IIR stages and a proportional-integral (PI) controller. Equation (18) is a linearized z-domain model that includes the four cascaded single-stage IIR filters, each with an attenuation factor $\lambda_i$, where i=0 . . . 3 as well as the proportional and integral parts of the loop. The loop filter operates at the $f_{VD} \cong f_V/32$ rate, where $f_V$ is the DCO output frequency.

$$H_{loop}(z) = \bar{\alpha} \cdot \prod_{i=0}^{3} \frac{\lambda_i}{1+(1-\lambda_i)z^{-1}} + \bar{\rho} \cdot \frac{z^{-1}}{1-z^{-1}} \qquad (18)$$

Alternately, ADPLL also supports a mode in which the integral part of the PI controller also operates on filtered phase error computed by operating a set of cascaded IIR filters on the resampled PHE signal. The main advantage of this mode is that as the integral part operates on an error signal, which has undergone low pass filtering after resampling (identical to the proportional part) resulting in better group delay equalization of the two paths. Note that in this mode the phase margin of the ADPLL under similar conditions will be sacrificed. In this mode, the loop filter can be expressed as follows:

$$H_{loop}(z) = \left(\bar{\alpha} + \bar{\rho} \cdot \frac{z^{-1}}{1-z^{-1}}\right) \cdot \prod_{i=0}^{3} \frac{\lambda_i}{1+(1-\lambda_i)z^{-1}} \qquad (19)$$

Note that the coefficients α (alpha) and ρ (rho) control the overall gain of filter 1222. Operation of these two coefficients will be described in more detail below.

$$\frac{\phi_R^n}{2\pi}, \frac{\phi_V^n}{2\pi} \text{ and } \frac{\phi_{TDC}^n}{2\pi}$$

are the reference, variable (DCO) and the TDC error source contributions, respectively. For simplicity, the feed-forward path comprises of the DCO represented only as the frequency scaling factor $K_{DCO}$. For simplicity, the phase accumulation of the DCO has been modeled as a discrete integrator running at $f_{VD}$ rate in the feedback path. Note that the DCO integration can also be represented using the Bilinear/Tustin transformation. This is equivalent to running the DCO at the $f_V$ rate and then scaling the phase accumulation at the output to the $f_{VD}$ rate.

$$H_{DCO}(z) = \frac{z^{-1}}{1-z^{-1}} \cdot \frac{1}{f_{VD}} \qquad (20)$$

The simplified feed-forward transfer function of the loop is $$H_{FF}(z) = \frac{z^{-1}}{1-z^{-1}} \cdot \left(\bar{\alpha} \cdot \prod_{i=0}^{3} \frac{\lambda_i}{1+(1-\lambda_i)z^{-1}} + \bar{\rho} \cdot \frac{z^{-1}}{1-z^{-1}}\right) \cdot \frac{f_{VD}}{f_R} \cdot r \qquad (21)$$

where r is the dimensionless ratio representing the DCO gain estimation error.

The transfer function of the feedback components is $$H_{FB}(z) = \frac{z^{-1}}{1-z^{-1}} \cdot \frac{1}{f_{VD}} \cdot 1 - z^{-1} = \frac{z^{-1}}{f_{VD}} \qquad (22)$$

The closed loop transfer function for the reference is lowpass with the gain multiplier N=FCW, i.e., $$H_{cl,REF}(z) = N \cdot \frac{H_{FF}(z)}{1+H_{FF}(z) \cdot H_{FB}(z)} \qquad (23)$$

The closed loop transfer function for the TDC is lowpass. Neglecting the accumulation and the differentiation operations in the feedback path, we can write the closed-loop transfer function for TDC as $$H_{cl,TDC}(z) = \frac{H_{FF}(z)}{1+H_{FF}(z)} \qquad (24)$$

The closed loop transfer function for the direct-point injection into the DCO is highpass in nature and is given by $$H_{cl,DCO}(z) = \frac{1}{1+H_{FF}(z) \cdot H_{FB}(z)} \qquad (25)$$

Figure 7:
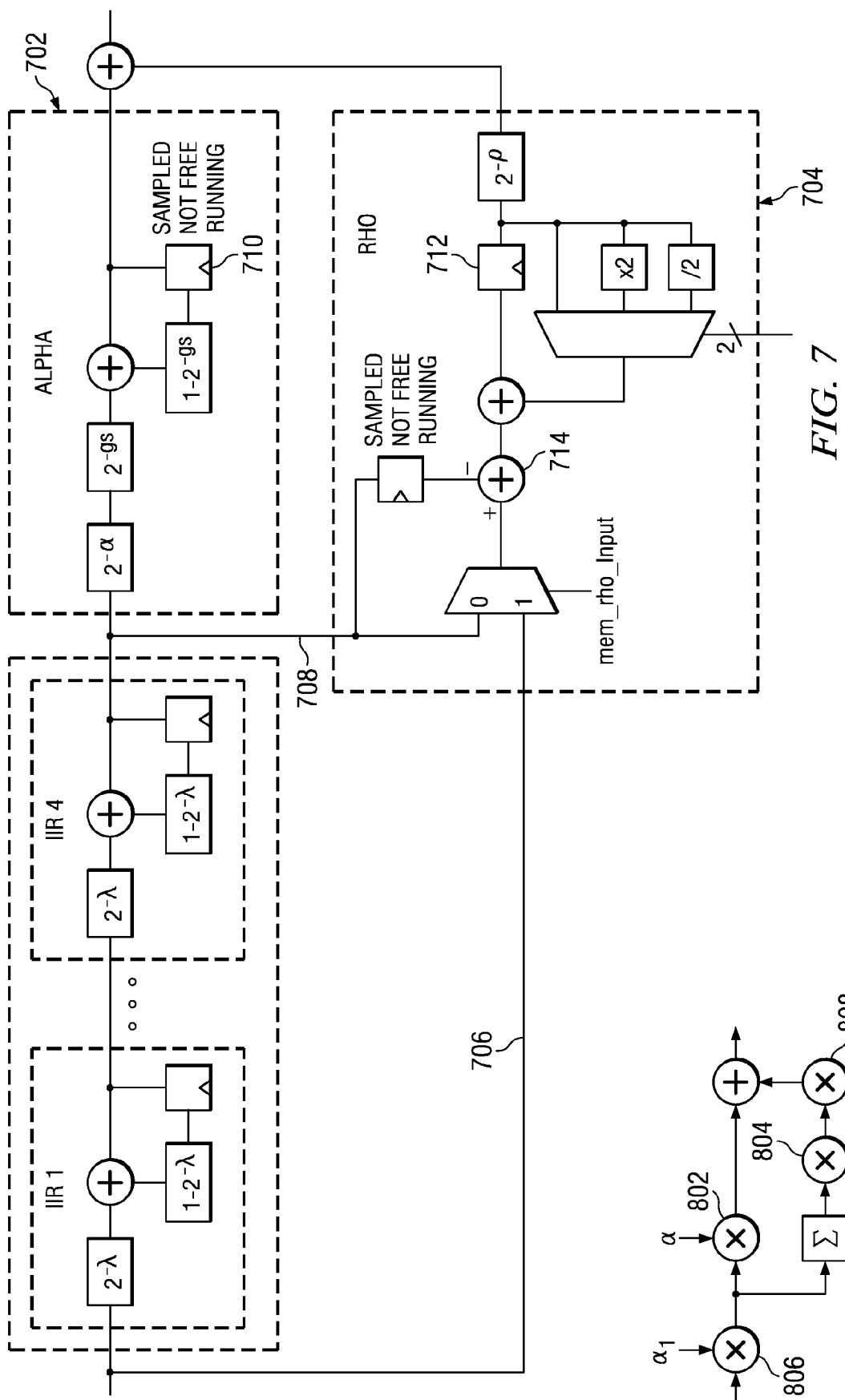
FIG. 7 is a block diagram of the ADPLL loop filter with a proportional (alpha) gear-shifting circuit and an integral (rho) gear shifting circuit.

FIG. 7 is a block diagram of the ADPLL loop filter 1222 with proportional (alpha) gear-shifting circuit 702 and integral (rho) gear shifting circuit 704. The amplitude and phase transfer function differences using the ADPLL loop filters in the configurations as captured in Eq. 18 and 19 impacts the ADPLL closed loop performance as well. Note that all the transfer functions are a function of the DCO frequency $f_V$ or its derivatives, such as CKVDx The primary advantage of operating the ADPLL on the $f_{VD}$ frequency is the improved spectrum and better rejection of the reference spurs. However, this results in the ADPLL loop response to vary as a function of DCO frequency for fixed ADPLL tuning parameters. Although this ADPLL BW variation is quite small, it can be taken care of by optimal tuning of the ADPLL loop parameters as a function of the DCO output frequency. Note that for the entire GSM/EDGE tuning range this variation is less than 4% of PLL BW and less than 2% of the ADPLL phase margin.

Some operating points computed for GSM modulation using the model presented in equations 18~25 are shown in Table 1. The coefficients are power-of-two exponents.

TABLE 1

ADPLL Loop Parameters - Channel Frequency = 1800 MHz

| lambda1 | lambda2 | lambda3 | lambda4 | alpha | rho | 0 dB loop BW [kHz] | Gain Margin [dB] | Phase Margin [deg] | 50 kHz Loop Gain [dB] | 400 kHz Loop Gain [dB] | 3 MHz Loop Gain [dB] |
|---|---|---|---|---|---|---|---|---|---|---|---|
| 4 | 6 | 6 | 6 | 8 | 18 | 15.57 | 17.64 | 45.00 | −10.22 | −66.53 | −98.31 |
| 2 | 4 | 4 | 6 | 7 | 16 | 30.89 | 20.28 | 45.23 | −2.04 | −36.02 | −87.14 |
| 5 | 6 | 2 | 0 | 7 | 16 | 30.87 | 21.09 | 45.05 | −2.06 | −36.92 | −93.12 |
| 3 | 5 | 5 | 5 | 7 | 16 | 31.15 | 17.38 | 44.81 | −1.70 | −38.27 | −86.31 |
| 1 | 5 | 6 | 6 | 6 | 19 | 44.16 | 9.96 | 45.48 | 2.53 | −41.59 | −106.55 |
| 1 | 3 | 4 | 6 | 6 | 15 | 54.24 | 16.68 | 45.30 | 2.60 | −28.40 | −85.65 |
| 3 | 3 | 5 | 0 | 6 | 14 | 61.66 | 20.02 | 45.10 | 3.36 | −21.80 | −86.01 |
| 2 | 3 | 3 | 6 | 5 | 16 | 85.54 | 13.29 | 45.48 | 1.35 | −21.81 | −78.03 |
| 2 | 3 | 4 | 4 | 5 | 13 | 110.90 | 12.56 | 44.72 | 2.27 | −13.40 | −72.09 |
| 2 | 2 | 3 | 3 | 5 | 12 | 124.06 | 16.51 | 44.76 | 2.24 | −9.71 | −57.03 |

Proportional and Integral Gain Gear Shifting

An important issue in frequency synthesis for today's wireless applications is the acquisition or settling time to a new channel frequency from the trigger event to the instance when the wireless terminal is ready to transmit or receive with the specified low level of frequency error, phase noise and spurious tones.

The gain of ADPLL control loop requires special settings for different modes of operation. Gear shifting changes the gain of the control loop to suit the various operating modes. For example, it is desirable to have high loop bandwidth while initially locking in acquisition mode in order that the PLL settle quickly. In tracking mode, however, it is desirable to have a low loop bandwidth to increase the performance of the PLL. Increasing the loop gain widens the bandwidth of the loop while decreasing the loop gain narrows the loop bandwidth.

Both the proportional and integral loops have the capability to change their bandwidths via gear shifting. The proportional loop is controlled by coefficient α (alpha), while the integral loop is controlled by coefficient ρ (rho) When a gear shift happens, the gear shift value increments (or decrements) the corresponding gain. A gear shift mechanism is described in more detail in U.S. Pat. No. 7,498,890 entitled "CONTINUOUS REVERSIBLE GEAR SHIFTING MECHANISM" and which is incorporated by reference herein in its entirety.

Both alpha and rho together affect the bandwidth or more particularly, frequency response, of the ADPLL. In the IIR gear shift block, the IIR filter is unity gain. Unity gain is defined as a gain of linear 1 or 0 dB at DC when clocked continuously. The lambda (λ) coefficients, however, can be changed without negative implications to the operation of the gear shift mechanism or loop performance.

With reference to the proportional alpha gear shift mechanism 702, alpha and gain (g) are multiplied together to provide an effective alpha. The gear shifting is effected in this manner whereby the feed forward gain is changed without generating a DC perturbation to the system.

With reference to the integral rho gear shift block 704, register 712 and adder 714 function as an integrator to accumulate the p gain. The p gear shift is operative to accumulate the unfiltered phase error 706 or filtered phase error 708 and multiply the result by the value rho. This changes the dynamics of the loop from type-I to type-II operation. A type-I is an integrator-free system (the only integrator would be the DCO) wherein loop operation is proportional. A type-II loop has an integrator in its loop. A type-I loop is used when faster loop settling is desired and type-II loop is used when better noise performance is desired, especially removal of the DCO flicker noise.

When operating in a type I loop, the alpha gear shifting is sufficient since the integral portion (i.e. the rho gear shift) is not active. When the loop moves to type II operation, both the alpha and the rho coefficient values must be changed simultaneously to effect a gear shifting of the loop bandwidth without substantially changing the frequency response shape (only scaling would be preferred) and without negatively affecting the loop stability, such as gain or phase margins, or damping factor for type-II second-order systems.

For the dynamic proportional gain gear-shifting, the feedback register 710 needs to sample a new value for the feedback path. Gear shifting can occur during any of the ADPLL operational modes; however, it is currently most useful for during tracking and for bandwidth on demand in response to predicted DCO pulling. Although the ADPLL loop bandwidth can be adjusted independently using either proportional (coarse change) or integral (finer change) gains, the possibility to simultaneously gear-shift both alpha and rho allows the ADPLL loop bandwidth to change while maintaining the phase and stability margins for the loop.

Gear-shifting a PLL implies a dynamically change of the PLL loop parameters such as loop gain, loop bandwidth, etc. However, for an ADPLL with loop filter as described in eq. 11, the loop parameters are a function of all the loop filter components that includes the parameters for the filtering and proportional-integral regulator. Using equation 16, it is clear that for the specific loop filter configuration shown, the ADPLL damping ratio is directly proportional to the proportional gain α and the cascaded IIR filter transfer function F(s), while it is inversely proportional to the square root of the integral gain ρ. Therefore, if the loop parameters are to be changed while preserving the phase margin of the ADPLL, then all the aforementioned parameters need to be gear-shifted (or switched) simultaneously.

A set of examples have been provided below for selective ADPLL parameter gear-shifts, that show the dependence of ADPLL loop BW and phase margin on the IIR co-efficient and PI controller gains. Please note that all the loop filter coefficients have been implemented as $2^{-n}$ coefficients, where n is as specified in the tables below, such that, if n1>n2, then $2^{-n1} < 2^{-n2}$.

Case A: Gear-shifting of IIR Filter(s)

In Table 2, one of the IIR filter coefficients has been decremented, resulting in slight widening of the IIR filter transfer function. As expected from the above equations, this results in the reduction of the ADPLL loop BW, while increasing the gain and phase margin of the system.

TABLE 2

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 2 | 4 | 4 | 5 | 6 | 15 | 122.08 | 12.19 | 46.09 |

Case B: Gear-shifting of PI Controller's Proportional Gain

Table 3 shows the impact of gear-shifting the proportional gain α down by one step. The impact is a big increase in the ADPLL loop BW, accompanied with a sharp decline in the gain and the phase margin of the system.

TABLE 3

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 5 | 15 | 211.64 | 5.78 | 28.74 |

Case C: Gear-shifting of PI Controller's Integral Gain

Table 4 shows the impact of gear-shifting the integral gain ρ up by one step. The impact is a decrease in the ADPLL loop BW, accompanied by an increase in the gain and the phase margin of the system.

TABLE 4

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 6 | 16 | 112.49 | 11.80 | 50.69 |

Case D: Simultaneous Gear-shifting of the PI Controller's Proportional and Integral Gains As per equation 9, if we neglect the contribution of the IIR filters, the ADPLL frequency damping and the damping ratio impacting the ADPLL loop BW and the phase margin is proportional to $$\frac{\alpha}{2 \cdot \sqrt{\rho}},$$

therefore, if we gear-shift α up by a factor of 2 (i.e., we gear shift α from 6 to 5, so $2^{(-5)}/2^{(-6)}=2$), then correspondingly the integral gain ρ will need to be gear-shifted by 4. However, when we do so, we observe that the PLL loop BW has scaled by approximately a factor of 2 as expected, however, the phase margin did not hold and shows severe degradation as shown in Table 5.

TABLE 5

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 5 | 13 | 229.99 | 4.33 | 17.85 |

Case E: Two-step Gear-Shifting of the IIR and PI Controller Gains

While the above discussions suggest switching all parameters together is beneficial, it may be useful to have a gear-shifting sequence in which alpha and rho gear-shift together, while the IIRs switch separately in two steps. In this embodiment the alpha/rho are gear-shifted, while the filter coefficients may have switchable settings. Operating this way, the system can still maintain the phase margin to better than approximately 40 degrees. The dwell time on the intermediate setting (with slightly narrower loop BW) is small and does not degrade the PLL system performance. The example in Table 6 shows gear-shifting from narrow to wider loop BW and the sequence gets reversed when switching to wider loop BW.

TABLE 6

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 0 | 3 | 4 | 5 | 6 | 15 | 108.43 | 14.87 | 50.87 |
| 0 | 3 | 4 | 5 | 5 | 20 | 206.66 | 9.75 | 44.46 |

Case F: Simultaneous Gear-shifting of the IIR and PI Controller Gains

Table 7 shows that if we simultaneously gear-shift the ADPLL's PI controller parameters, while switching the IIR filter coefficients, we can change the ADPLL loop BW while maintaining adequate phase margin. The possible range of gain margin decreases whenever the loop BW is increased as expected for a type-II or higher system. However, note that using the simultaneous switching of IIR filter co-efficients and PI controller parameters, the system can gear-shift between a large set of loop bandwidths, while achieving good gain and phase margins. For good operation, maintaining the bandwidth margin above about 40 degrees provides good results. Some such examples have been presented In Table 7.

TABLE 7

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 0 | 3 | 4 | 5 | 5 | 20 | 206.66 | 9.75 | 44.46 |
| 2 | 4 | 4 | 6 | 7 | 16 | 61.19 | 16.58 | 44.95 |

Figure 8:
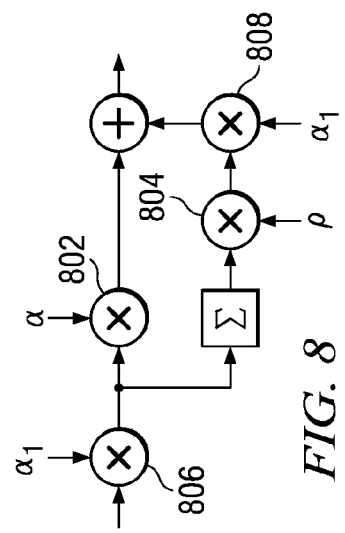
FIG. 8 is a block diagram of another embodiment illustrative of a way to perform gear shifting in the ADPLL loop filter.

FIG. 8 is a block diagram of another embodiment illustrative of a way to perform gear shifting in loop filter 222. Multipliers 802 and 804 introduce alpha and rho coefficients, respectively, into the filter process. Multipliers 806 and 808 insert a common $\alpha_1$ coefficient as indicated. The multipliers are advantageously realized as bit shift operators for power-of-two multiplying coefficients. The common $\alpha_1$ multiplier ensures that alpha and rho maintain the square-root relationship, which maintains the damping factor zeta, as discussed above.

Figure 9:
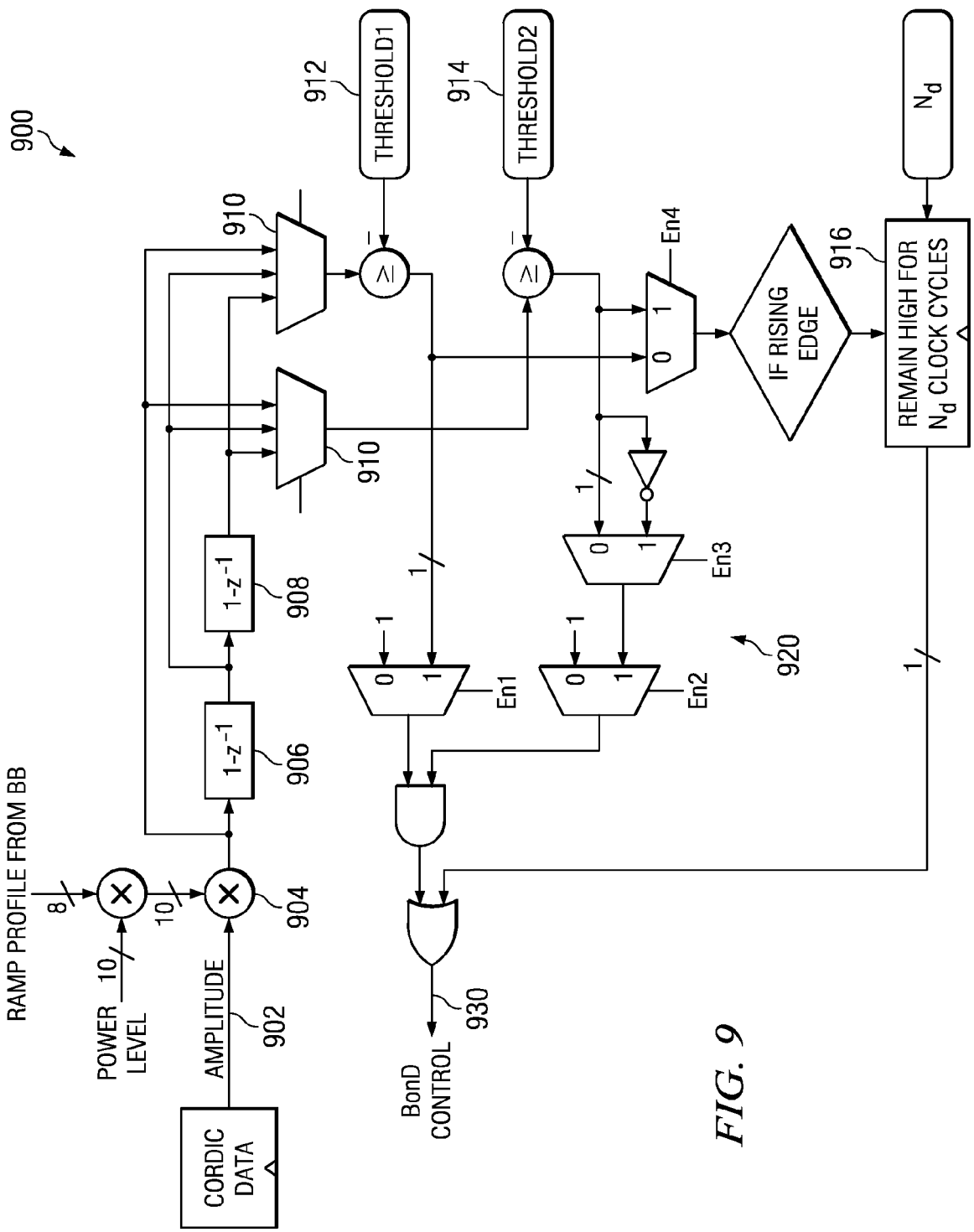
FIG. 9 is a block diagram of circuitry to detect and initiate bandwidth on demand in the ADPLL.

FIG. 9 is a block diagram of bandwidth on demand (BonD) circuitry 900 to detect and initiate bandwidth on demand in the ADPLL. FIG. 9 illustrates one embodiment of bandwidth on demand detecting circuitry as illustrated by BonD module 260 of FIG. 3. As mentioned earlier, the complex vector modulation I/Q (in-phase signal and quadrature signal) data streams are fed to a COordinate Rotation DIgital Computer (CORDIC) within processor 212 (see FIG. 3), which converts it from Cartesian to polar representation. The resulting amplitude modulation signal 902 is passed through sigma-delta amplitude (SAM) signal processing blocks 214 before they are passed onto the on-chip digital pre-power amplifier (DPA) 234, while the phase modulation output of the Cordic is passed onto the ADPLL after the necessary interpolation and signal processing, which performs the phase modulation of the DCO.

BonD module 900 also monitors amplitude modulation signal 902. It may scale the signal via multiplier 904 in response to control signals from the script processor. It then takes a first derivative 906 and a second derivative 908 to determine the rate of change in amplitude and the acceleration of the change in amplitude, respectively. Multiplexors 910 allow selection of any of the three indicators in response to control signals from the script processor. One selected indicator is compared against a first threshold 912 and the other selected indicator is selected against a second threshold 914. Both thresholds are set based on a parameter provided by the script processor. A timer 916 is also started when one of the thresholds is crossed, if enabled by the script processor. A set of multiplexors and gates, generally indicated at 920, under control of enable signals controlled by the script processor then combines the results of the threshold comparisons and the timer and generates a BonD control signal 930 that is used to cause one or more parameters of the loop filter to be changed to thereby change the loop bandwidth.

For example, BonD circuitry 900 can be set up by the script processor to detect when the amplitude modulation signal or a derivative of the amplitude signal crosses the first threshold and to then cause an increase in loop bandwidth by asserting control signal 930. After a short period of time determined by the counter, BonD can then cause a decrease in the loop bandwidth by de-asserting control signal 930.

Alternatively, BonD circuitry 900 can be set up by the script processor to detect when the amplitude modulation signal or a derivative crosses the first threshold and to then cause an increase in loop bandwidth by asserting control signal 930. After the selected signal indicator falls below the first threshold, BonD can then cause a decrease in the loop bandwidth by de-asserting control signal 930.

Alternatively, BonD circuitry 900 can be set up by the script processor to detect when the amplitude modulation signal or a derivative crosses the first threshold and to then cause an increase in loop bandwidth by asserting control signal 930. After the selected signal indicator falls below the second threshold, BonD can then cause a decrease in the loop bandwidth by de-asserting control signal 930.

As can be seen, there is a large number of possibilities than can be configured using configurable BonD circuit 900 to monitor the amplitude modulation signal and to change parameters in the loop filter to increase loop bandwidth when the amplitude signal is changing in value in a significant manner. The change in value of the amplitude signal is what causes the power consumption of the pre-amplifier to change and to thereby cause pulling of the DCO frequency. One the amplitude signal has returned to a more steady-state value, BonD circuitry 900 can then sense this condition, either by threshold or by time delay, and reduce the loop bandwidth.

In a similar manner, BonD 900 may also be embodied in a manner that the phase modulation signal from the CORDIC is also monitored. By taking a derivative of the phase modulation signal, a significant difference in phase can be detected and loop bandwidth increased for a short period of time. In wide bandwidth polar modulation (e.g., EDGE, WCDMA, WLAN, HSUPA, LTE, etc.), the frequency modulation signal exhibits large frequency modulation requirements, due to the complex constellation either approaching or passing through the origin. Such large instantaneous modulation spikes in FM (or a change of instantaneous phase), causes a change in the oscillator output impedance, which has a measurable impact on the quality (or fidelity) of PLL lock. In such cases, the PLL BW can be widened as a function of the instantaneous frequency modulation that the PLL is being modulated with.

Figure 10:
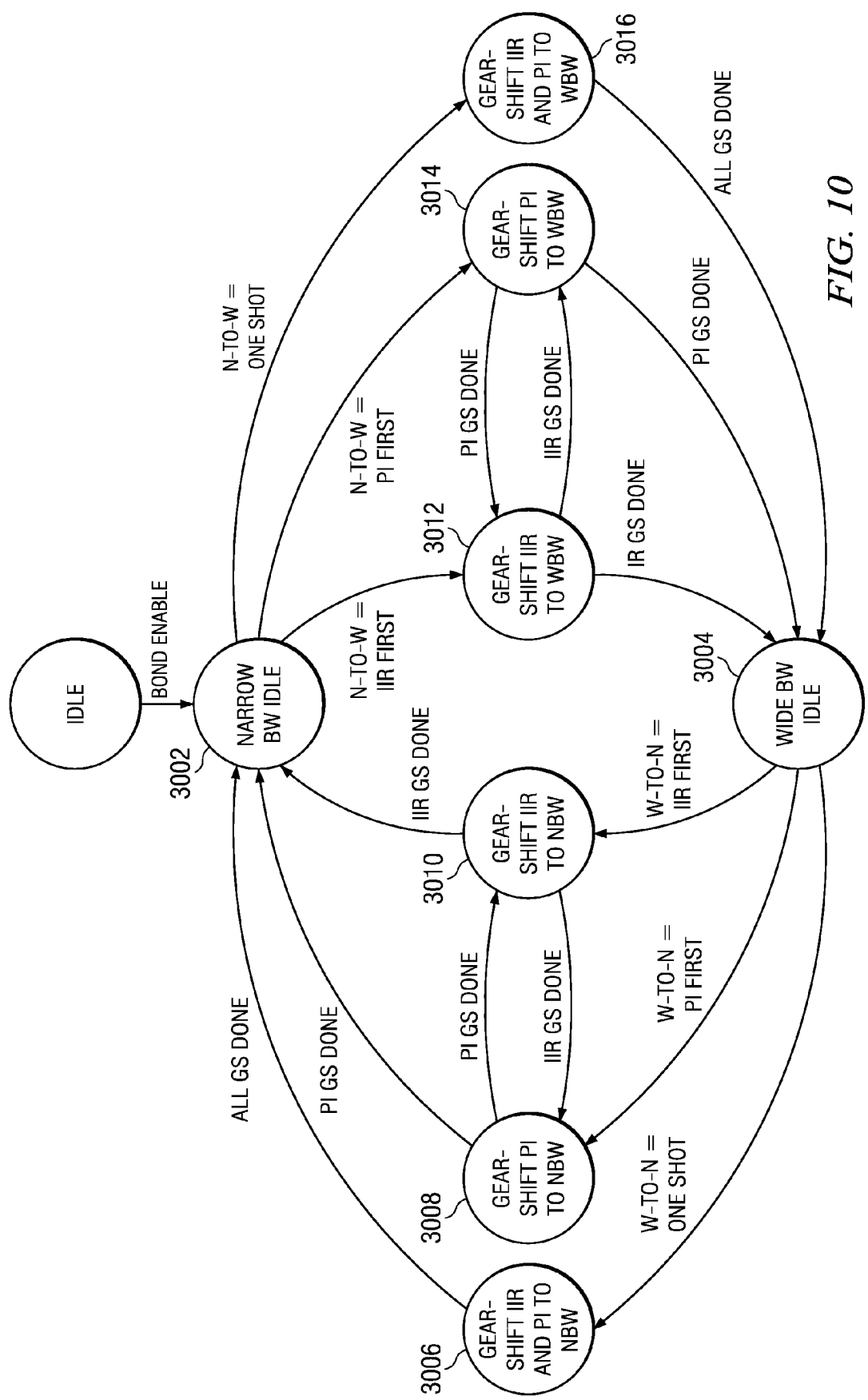
FIG. 10 is a state diagram illustrating operation of the ADPLL bandwidth change sequence controller.

FIG. 10 is a state diagram illustrating state transitions from a narrow bandwidth filter state 3002 to a wide bandwidth filter state 3004 and vice versa in response to the BonD control signal 930 being asserted and de-asserted. ADPLL loop bandwidth (BW) switching is typically triggered in anticipation of events and/or disturbances that potentially impact the quality of the locked local oscillator clock generated by the ADPLL and the DCO system. When bandwidth on demand is enabled in this embodiment, changes are made in response to detecting that an amplitude of the transmission symbols, a derivative of amplitude, or a derivative of phase of the transmission symbols has crossed a threshold, as discussed above. Depending on operating conditions and current coefficient settings, the transition may be made by changing the IIR coefficients and the proportional-integral coefficients $\alpha$ and $\rho$ all simultaneously in state 3006 or state in 3016. The transition may also be made by changing only $\alpha$ and p simultaneously in state 308 or in state 3014. In other cases, the transitions may be made by changing only the IIR coefficients in state 3010 or in state 3012. Alternatively, in some conditions the transition may be made by first changing only $\alpha$ and $\rho$ simultaneously in state 308 or in state 3014 and then jumping to state 3010 or 3012 respectively to change one or more IIR coefficients. Likewise, the transition can be made via state 3010 to state 3008 or state 3012 to state 3014.

Figure 11:
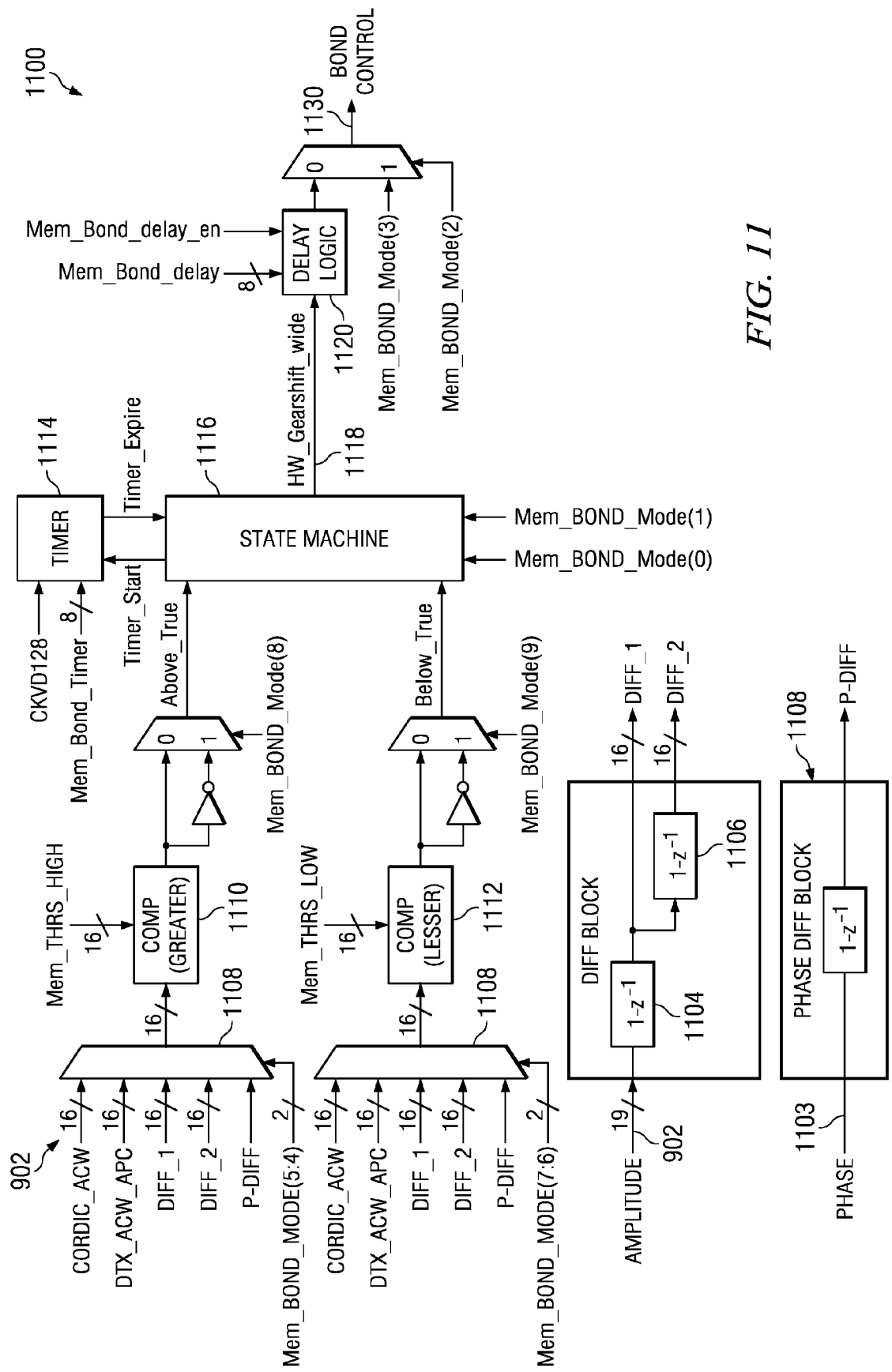
FIG. 11 is a block diagram of another embodiment of a circuit to detect and initiate bandwidth on demand in the ADPLL.

FIG. 11 is a block diagram of another embodiment of a BonD circuit 1100 to detect and initiate bandwidth on demand in the ADPLL. BonD module 1100 also monitors amplitude modulation signal 902. It then takes a first derivative 1104 and a second derivative 1106 to determine the rate of change in amplitude and the acceleration of the change in amplitude, respectively. In some embodiments, the phase modulation signal 1103 from the CORDIC is also monitored. By taking a derivative 1108 of the phase modulation signal, a significant difference in phase can be detected. Multiplexors 1108 allows selection of any of the various indicators in response to control signals from the script processor. Another indicator that may be monitored in some embodiments is a filtered version of the amplitude modulation signal DTX_ACW_APC from DTX module 250. The selected first indicator is compared against a first threshold in comparator 1110 that asserts its output signal ABOVE_TRUE when the first threshold is exceeded. The selected second indicator is also compared against a second threshold in comparator 1112 that asserts its output signal BELOW_TRUE when the selected indicator is less than the second threshold. The thresholds may be configured to be the same or different. The thresholds are set based on parameters provided by the script processor. A timer 1114 is also started in response to a control signal from state-machine 1116. The timer is based on CKVD128 clock rate (12.6 to 15.6 MHz). Its maximum delay at the highest clock rate is about 16 us. State-machine 1116 under control of enable signals controlled by the script processor then combines the results of the threshold comparisons and the timer and generates a HW_GEARSHIFT_WIDE control signal. This signal is then delayed by a programmable delay circuit 1120. Delay circuit 1120 is based on CDVD32 clock rate (50 to 62 MHz). Its maximum delay at highest clock rate is about 4 μsec. This allows the adjustment to the loop bandwidth to be delayed by a programmable delay when either threshold is crossed or after the time delay interval. This programmable delay is used to account for any delay or mismatch between a transmission symbol being detected and its actual affect on the DCO. Typically, the amount of the programmable delay would be determined by testing or by simulation of a complete design.

The output of delay logic 1130 produces BonD control signal 1130 that is used to cause one or more parameters of the loop filter to be changed to thereby change the loop bandwidth. When asserted, the loop filter is changed to wide bandwidth mode and when de-asserted the loop filter is changed to narrow bandwidth mode. The transition from wide to narrow and from narrow to wide may be performed according to the state diagram of FIG. 10.

Table 8 and Table 9 illustrate an embodiment of two control registers that may be accessed by the script processor to control the thresholds and the operation of the BonD circuit, respectively.

TABLE 8

DTX_BOND_THRSH = Address 0x0694

| Bit | Name | Function | Value at reset |
|---|---|---|---|
| 31:16 | mem_bond_thrsh_high | This 16-bits sign number is used to set the higher threshold value of Bond functionality | "0001_1001_0101_0000" |
| 15:0 | mem_bond_thrsh_low | This 16-bits sign number is used to set the lower threshold value of Bond functionality | "0000_1001_0000_0000" |

TABLE 9

DTX_BOND-CTL = Address 0x0698

| Bit | Name | Function | Value at reset |
|---|---|---|---|
| 31:24 | mem_bond_delay | Vlaue of this register is used to delay the output of DTX_BOND state machine to DLO by kvd32 clock cycles if mem_bond_delay en is set to '1' | "00000000" |

TABLE 9-continued

DTX_BOND-CTL = Address 0x0698

| Bit | Name | Function | Value at reset |
|---|---|---|---|
| 23:16 | mem_bond_timer | Value of this register is used to control the duration (number of CKVD128 cycles) of DLO gear shifting when output of either threshold comparators is true. | "00110000" |
| 15:11 | NU | | |
| 10:10 | mem_bond_delay_en | If set to '1' then value of mem_bond_delay register isused delay the output of Bond State machine to DLO. | "0" |
| 9:0 | mem_bond_mode | These bits are used to control the DTX BOND functionality<br>Bit(0) = If set to '1' DTX Bond Hardware is enabled.<br>Bit(1) = This bits control DTX BOND operation if Bit(0) is '1'; '0' => Simple Mode, '1' => Complex Mode<br>Bit(2) = If set to '1' output of DTX Bond is controlled by Bit(3); if set to '0' Bond State Machine controls the DTX Bond output.<br>Bit(3) = Value of this bit is assigned to DTX BOND output if Bit(2) is set to '1'.<br>Bits(5:4) = These bits are used to control the input to the Higher Threshold Comparator:<br>00 => Output of Edge Cordic block<br>01 => Output of Edge APC block<br>10 => First order differentiation of Edge APC output<br>11 => Second order differentiation of Edge APC output<br>Bits(7:6) = These bits are used to control the input to the Lower Threshold Comparator:<br>00 => Output of Edge Cordic block<br>01 => Output of Edge APC block<br>10 => First order differentiation of Edge APC output<br>11 => Second order differentiation of Edge APC output<br>Bit(8) = If set to '1' output of Higher Threshold Comparator is inverted.<br>Bit(9) = If set to '1' output of Lower Threshold Comparator is inverted. | "00000100" |

Figure 12:
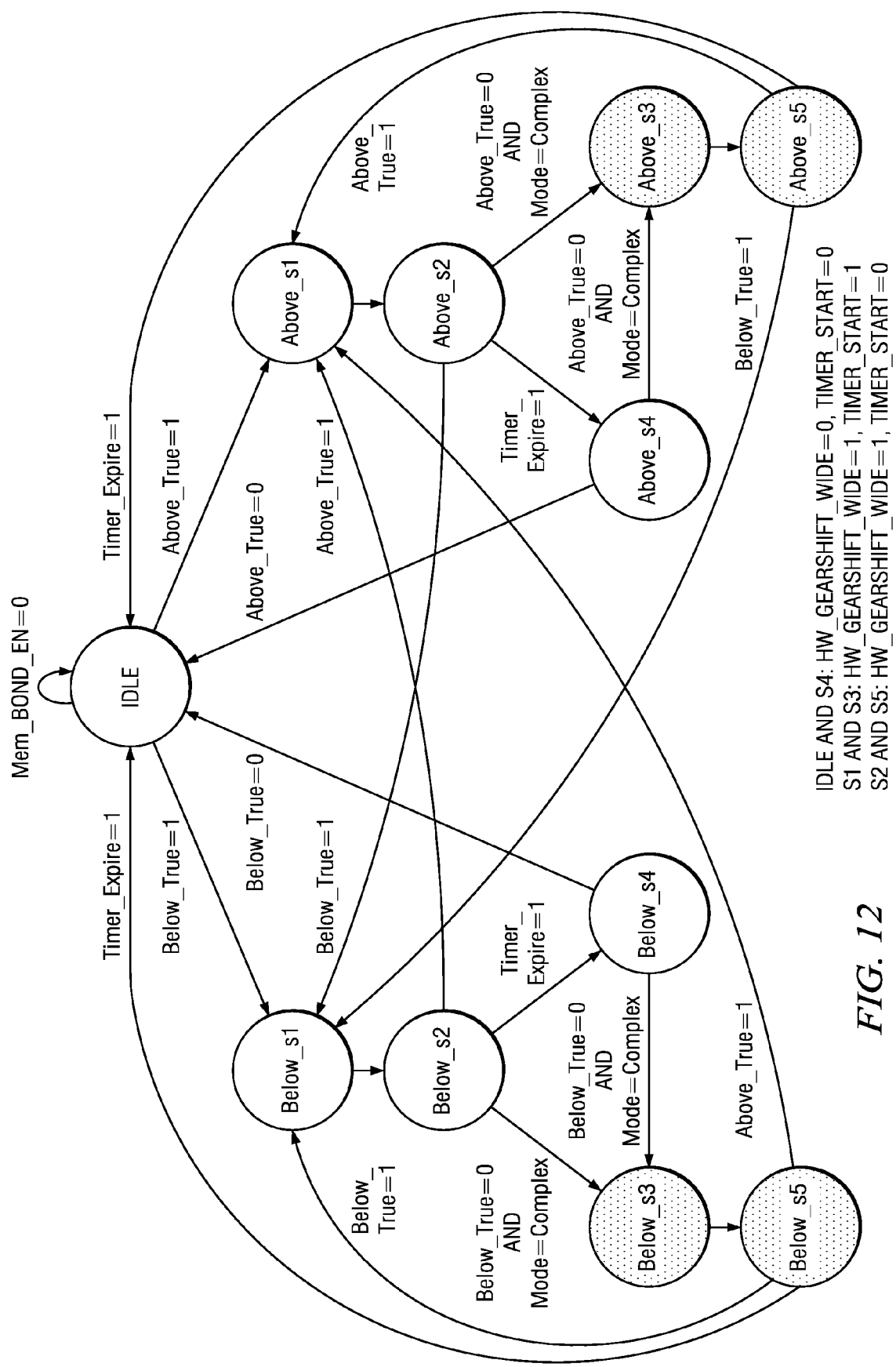
FIG. 12 is a state diagram illustrating operation of the bandwidth on demand controller of FIG. 11.

FIG. 12 is a state diagram illustrating operation of the bandwidth on demand controller of FIG. 11. When BonD mode is enabled by the script processor, comparator outputs are monitored during the IDLE state. During the IDLE state, BonD control signal 1130 is de-asserted to maintain the loop bandwidth in narrow mode. When the ABOVE_TRUE signal is asserted in response to a selected indicator crossing a threshold, the ABOVE_S1 state is entered, and when the BELOW_TRUE signal is asserted, the BELOW_S1 is entered. During each of states S1, S2, S3 and S4 the BondD control signal 1130 is asserted to cause one or more parameters of the loop filter to be changed to thereby change the loop bandwidth to wide mode. State S1 also asserts the TIMER_START signal and then transitions to state S2. If not in complex mode, as configured by the script processor, the state machine stays in S2 until the timer expires and then goes to state S4 where BonD signal 1130 is de-asserted to cause the loop filter to be changed to narrow bandwidth mode. Once the ABOVE_TRUE or BELOW_TRUE signal is de-asserted, the state machine returns to IDLE.

If the script processor has configured the complex mode, then state S3 is entered from state S4 when the ABOVE_TRUE or BELOW_TRUE signal is de-asserted. Similarly, if the ABOVE_TRUE or BELOW_TRUE signal is de-asserted before the timer expires, then state S3 is entered from state S2. State S3 restarts the timer and then transitions to state S5. If in ABOVE_S5, then the state machine will transition to IDLE if the timer expires; or transition to ABOVE_S1 if the ABOVE_TRUE signal is asserted; or transition to BELOW_S1 if the BELOW_TRUE signal is asserted. Similarly, if in BELOW_S5, then the state machine will transition to IDLE if the timer expires; or transition to BELOW_S1 if the BELOW_TRUE signal is asserted; or transition to ABOVE_S1 if the ABOVE_TRUE signal is asserted.

In this manner, the BonD control signal can cause the loop filter to be changed to wide bandwidth mode when a threshold is crossed and remain in wide mode for a timed period. If the other threshold is crossed before the timer expires, then wide bandwidth mode will be retained for another period of time until the timer expires, at which time the loop filter will be changed to reestablish narrow bandwidth mode.

Typically, a particular system will be tested and the script processor will be programmed to select the mode of operation, the thresholds and time durations that produce the best result over a range of conditions.

Figure 13:
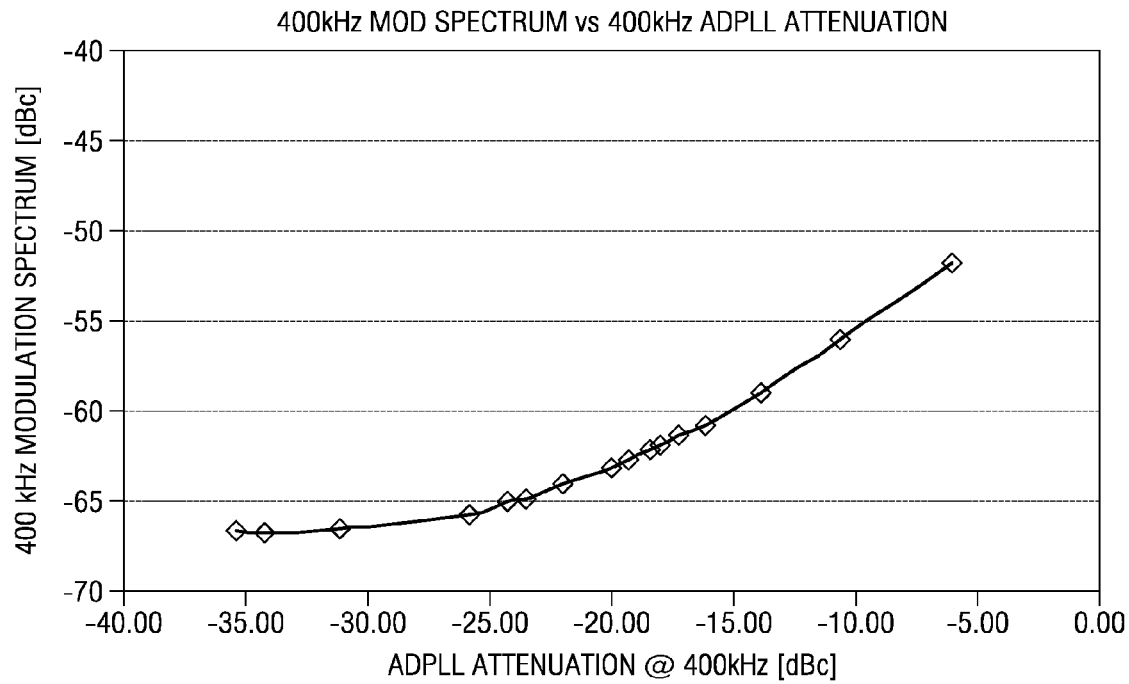
FIG. 13 is a plot of modulation spectrum vs attenuation in the ADPLL.

FIG. 13 is a plot of modulation spectrum vs attenuation in the ADPLL at 400 kHz. This plot illustrates the affect on bandwidth which rises as loop attenuation is reduced.

Figure 14:
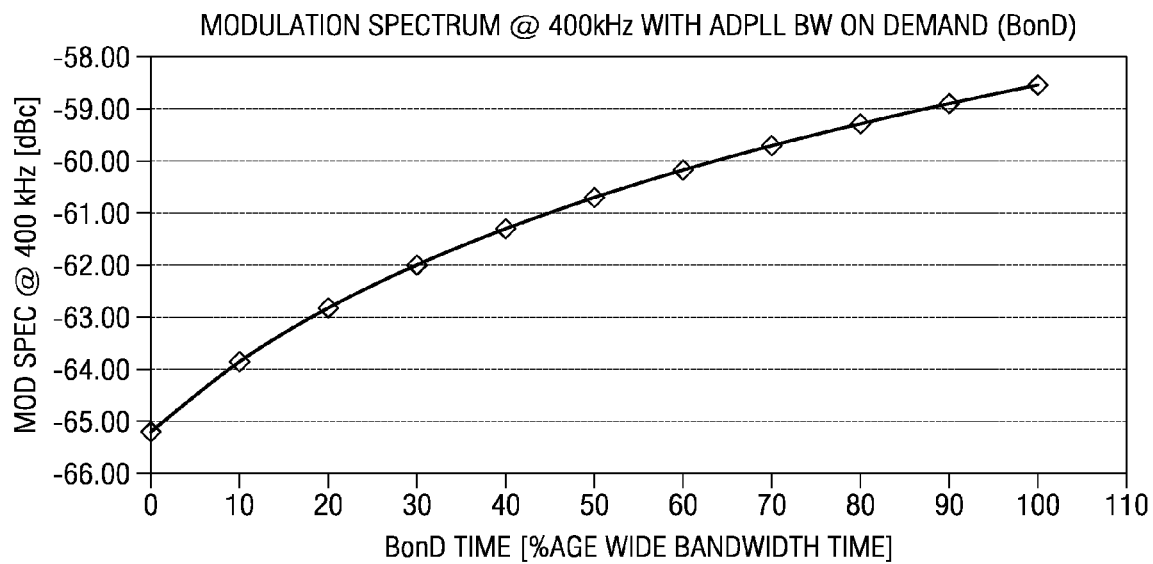
FIG. 14 is a plot illustrating modulation spectrum vs percentage of wide bandwidth time.

FIG. 14 is a plot illustrating modulation spectrum vs percentage of wide bandwidth time at 400 kHz. This plot illustrates the effective average spectrum changes from 0% BonD duration to 100% wide bandwidth duration.

Figure 15:
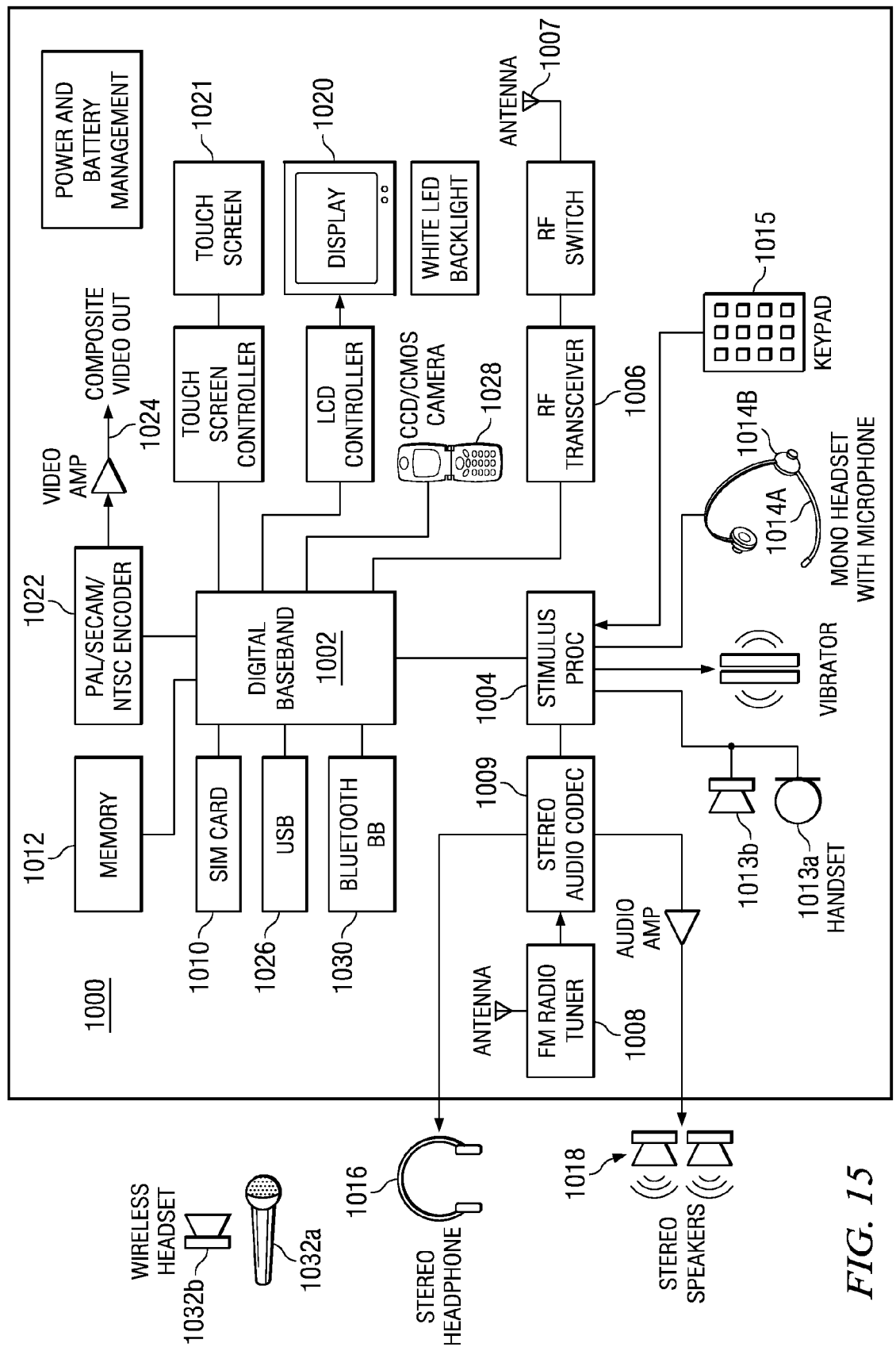
FIG. 15 is a block diagram of a digital system with an embodiment of an ADPLL using bandwidth on demand within a digital radio transceiver.

FIG. 15 is a block diagram of mobile cellular phone 1000 for use in the network of FIG. 1. Digital baseband (DBB) unit 1002 can include a digital processing processor system (DSP) that includes embedded memory and security features. Stimulus Processing (SP) unit 1004 receives a voice data stream from handset microphone 1013a and sends a voice data stream to handset mono speaker 1013b. SP unit 1004 also receives a voice data stream from microphone 1014a and sends a voice data stream to mono headset 1014b. Usually, SP and DBB are separate ICs. In most embodiments, SP does not embed a programmable processor core, but performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

In this embodiment, the digital base band processing is included in a single integrated circuit chip with the transceiver in the form of a DRPu as a system on a chip (SOC).

RF transceiver 1106 is a digital radio processor and includes a receiver for receiving a stream of coded data frames from a cellular base station via antenna 1107 and a transmitter for transmitting a stream of coded data frames to the cellular base station via antenna 1107. At the heart of transceiver 1106 lies a digitally controlled oscillator (DCO), which deliberately avoids any analog tuning controls. Fine frequency resolution is achieved through high-speed dithering of its varactors. Digital logic built around the DCO realizes an interpolative all-digital PLL (ADPLL) that is used as a local oscillator for both the transmitter and receiver and operates as described above. The polar transmitter architecture utilizes the wideband direct frequency modulation capability of the ADPLL and a digitally controlled power amplifier (DPA) for the power ramp and amplitude modulation. In this embodiment, a single transceiver supports both GSM and WCDMA operation but other embodiments may use multiple transceivers for different transmission standards. Other embodiments may have transceivers for a later developed transmission standard with appropriate configuration. RF transceiver 1106 is connected to DBB 1102 which provides processing of the frames of encoded data being received and transmitted by cell phone 1100.

The basic WCDMA DSP radio consists of control and data channels, rake energy correlations, path selection, rake decoding, and radio feedback. Interference estimation and path selection is performed by instructions stored in memory 1112 and executed by DBB 1102 in response to signals received by transceiver 1106. Programmable features of the ADPLL within transceiver 1106 are controlled by instructions executed by DBB 1102.

Embodiments of the present invention minimize signal quality degradation incurred due to pulling of the oscillator by noise or ground bounce caused by transients in amplitude modulation. In the current embodiment of the ADPLL architecture, which is strictly optimized for low area and power consumption, maintaining an excessive ADPLL bandwidth all the time in order to manage noise induced oscillator pulling would degrade spectral mask by less filtering of the reference and TDC (time to digital converter) phase noise. Embodiments of the present invention dynamically increase the ADPLL loop bandwidth only when it is really needed. During the course of modulation, the significant pulling force exists only for a fraction of the time. Therefore most of the time it is not strong enough to create a noticeable degradation in error vector magnitude (EVM). Engaging a wide ADPLL bandwidth only at the time of strong frequency pulling mitigates its negative effects and leads to only a small increase in the close-in phase noise, as described in more detail above. For example, if the duty cycle of the wide bandwidth is 50% then the resultant modulation spectrum will be midway between that of the normal bandwidth and wide bandwidth. Typically, the wide bandwidth duty cycle will be much less than 50%.

DBB unit 1002 may send or receive data to various devices connected to universal serial bus (USB) port 1026. DBB 1002 can be connected to subscriber identity module (SIM) card 1010 and stores and retrieves information used for making calls via the cellular system. DBB 1002 can also connected to memory 1012 that augments the onboard memory and is used for various processing needs. DBB 1002 can be connected to Bluetooth baseband unit 1030 for wireless connection to a microphone 1032a and headset 1032b for sending and receiving voice data. DBB 1002 can also be connected to display 1020 and can send information to it for interaction with a user of the mobile UE 1000 during a call process. Display 1020 may also display pictures received from the network, from a local camera 1026, or from other sources such as USB 1026. DBB 1002 may also send a video stream to display 1020 that is received from various sources such as the cellular network via RF transceiver 1006 or camera 1026. DBB 1002 may also send a video stream to an external video display unit via encoder 1022 over composite output terminal 1024. Encoder unit 1022 can provide encoding according to PAL/SECAM/NTSC video standards. In some embodiments, audio codec 1109 receives an audio stream from FM Radio tuner 1108 and sends an audio stream to stereo headset 1116 and/or stereo speakers 1118. In other embodiments, there may be other sources of an audio stream, such a compact disc (CD) player, a solid state memory module, etc

OTHER EMBODIMENTS

While the invention has been described with reference to illustrative embodiments, this description is not intended to be construed in a limiting sense. Various other embodiments of the invention will be apparent to persons skilled in the art upon reference to this description.

In another embodiment, the BonD module may monitor other indicators of frequency pulling. The pulling of the oscillator manifests itself as a degradation of RMS or peak phase error in the PLL. It also causes a degradation of TX close-in performance such as error vector magnitude (EVM) degradation or degraded adjacent channel leakage. For power aggressors, the coupling may correspond to envelope (or amplitude) squared, or their derivatives.

Various configurations of the BonD circuit and the controlling state machines were illustrated. In other embodiments, the detection circuit may be limited to only one or a few indicators. Other arrangements of the state machines may be used.

In another embodiment, parameters used for the IIR filters, alpha and rho may take on different values than were illustrated herein, based on a particular design, operating frequency(s) and voltages, design of a particular integrated circuit, and so on. Testing of production units may result in a final selection of parameters to use for the adjustment of bandwidth on demand.

While the invention has been described with reference to illustrative embodiments, this description is not intended to be construed in a limiting sense. Various other embodiments of the invention will be apparent to persons skilled in the art upon reference to this description. This invention applies to all scheduled communication systems which use digitally controlled oscillators. This invention applies in uplink and downlink. Various embodiments of this invention apply for many modulation strategies, which include but are not limited to, OFDMA, CDMA, DFT-spread FDMA, SC-OFDMA, and others. Embodiments of this invention can be applied in most if not all emerging wireless standards, including EUTRA.

While a mobile user equipment device has been described, embodiments of the invention are not limited to mobile devices. Desktop equipment and other stationary equipment being served by a cellular network may also embody an ADPLL as described herein.

Although the invention finds particular application to Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

An embodiment of the invention may include a system with a processor coupled to a computer readable medium in which a software program is stored that contains instructions that when executed by the processor perform the functions of modules and circuits described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A system, comprising a transmitter, wherein the transmitter comprises:
    a phase locked loop (PLL) having a dynamically controllable loop bandwidth, the PLL comprising an oscillator;
    a transmit modulator coupled to the PLL for performing vector modulation in response to transmission symbols, wherein each transmission symbol comprises an amplitude signal and a phase signal; and
    a controller coupled to the PLL and to the transmit modulator operable to detect when a criteria of the transmission symbols crosses a threshold and to adjust loop bandwidth in response to the criteria crossing the threshold.

2. The system of claim 1, wherein the criteria of the transmission symbols comprises a function of the amplitude signal or a function of the phase signal.

3. The system of claim 2, wherein the function of amplitude signal is selected from a group consisting of the amplitude signal, a first derivative of the amplitude signal, a second derivative of the amplitude signal, a square of the amplitude signal, and a derivative of the amplitude signal squared.

4. The system of claim 2, wherein the function of the phase signal is selected from the phase signal, and a derivative of the phase signal.

5. The system of claim 1, wherein the controller is operable to make a first adjustment to the loop bandwidth when the criteria of the transmission symbols crosses a first threshold and to make a second adjustment to the loop bandwidth when the criteria crosses a second threshold.

6. The system of claim 5, wherein the controller is operable to delay making the first adjustment by a programmable time delay.

7. The system of claim 1, wherein the controller is operable to make a first adjustment to the loop bandwidth when the criteria of the transmission symbols crosses a first threshold and to make a second adjustment to the loop bandwidth after a time delay interval.

8. The system of claim 7, wherein the controller is operable to delay making the first adjustment by a programmable time delay.

9. The system of claim 1, wherein the controller is operable to increase the loop bandwidth in response to detecting criteria of the transmission symbols being above the threshold.

10. The system of claim 1, wherein the controller is operable to decrease the loop bandwidth in response to detecting criteria of the transmission symbols being below the threshold.

11. The system of claim 1, wherein the PLL comprises:
    a frequency reference input for receiving a reference clock;
    a controllable oscillator for generating a radio frequency (RF) clock;
    a phase detection circuit operational to provide phase error samples indicative of phase difference between the RF clock and the reference clock for controlling the controllable oscillator; and
    a programmable filter connected to receive the phase error samples and connected to provide a filtered output to the controllable oscillator, the programmable filter comprising a proportional loop gain control having a programmable loop coefficient (alpha), wherein the loop bandwidth is adjustable in response to alpha.

12. The system of claim 11 wherein the programmable filter further comprises an integral loop gain control having a programmable loop coefficient (rho), wherein the loop bandwidth is adjustable in response to rho.

13. The system of claim 11, wherein the programmable filter further comprises one or more linear filters each having a programmable linear filter coefficient, coupled to first receive the phase error samples, wherein the loop bandwidth is adjustable in response to the linear filter coefficients.

14. The system of claim 13, wherein the programmable filter coefficients are configured such that at least one linear filter coefficient is changed before or after changing alpha.

15. The system of claim 11 wherein the programmable filter further comprises:
    an integral loop gain control having a programmable loop coefficient (rho), wherein the loop bandwidth is adjustable in response to rho;
    one or more linear filters each having a programmable linear filter coefficient, coupled to first receive the phase error samples, wherein the loop bandwidth is adjustable in response to the linear filter coefficients; and
    wherein the loop bandwidth is adjusted by changing one or more of a group consisting of the one or more programmable filter coefficients, alpha and rho.

16. The system of claim 15, wherein two or more of the group are changed simultaneously.

17. The system of claim 15, wherein one or more of the group are changed in multiple steps.

18. The system of claim 1 being a cellular telephone, wherein the PLL forms a local oscillator.

19. A method for operating digital system comprising a transmitter having a phase locked loop with a dynamically controllable bandwidth, comprising:
- performing vector modulation in response to transmission symbols, wherein each transmission symbol comprises an amplitude signal and a phase signal;
- detecting when a criteria of the transmission symbols crosses a threshold; and
- adjusting loop bandwidth in response to the criteria crossing the threshold.

20. The method of claim 19, wherein adjusting loop bandwidth comprises:
- making a first adjustment to the loop bandwidth when the criteria of the transmission symbols crosses a first threshold; and
- making a second adjustment to the loop bandwidth after a time delay interval.

21. The method of claim 19, wherein adjusting loop bandwidth comprises:
- making a first adjustment to the loop bandwidth when the criteria of the transmission symbols crosses a first threshold; and
- making a second adjustment to the loop bandwidth when the criteria crosses a second threshold.

22. The method of claim 19, wherein adjusting loop bandwidth comprises delaying making each adjustment by a programmable time delay.

* * * * *